United States Patent
Yan

(10) Patent No.: US 10,516,111 B2
(45) Date of Patent: Dec. 24, 2019

(54) POLYMER/FULLERENE FORMATIONS AND THEIR USE IN ELECTRONIC/PHOTONIC DEVICES

(71) Applicant: The Hong Kong University of Science and Technology, Hong Kong (CN)

(72) Inventor: He Yan, Hong Kong (CN)

(73) Assignee: THE HONG KONG UNIVERSITY OF SCIENCE AND TECHNOLOGY, Hong Kong (CN)

(*) Notice: Subject to any disclaimer, the term of this patent is extended or adjusted under 35 U.S.C. 154(b) by 434 days.

(21) Appl. No.: 15/107,596

(22) PCT Filed: Dec. 26, 2014

(86) PCT No.: PCT/CN2014/095053
§ 371 (c)(1),
(2) Date: Jun. 23, 2016

(87) PCT Pub. No.: WO2015/096797
PCT Pub. Date: Jul. 2, 2015

(65) Prior Publication Data
US 2016/0322575 A1    Nov. 3, 2016

Related U.S. Application Data

(60) Provisional application No. 61/964,172, filed on Dec. 26, 2013.

(51) Int. Cl.
*C08G 61/12* (2006.01)
*C08L 65/00* (2006.01)
(Continued)

(52) U.S. Cl.
CPC ........ *H01L 51/0036* (2013.01); *C01B 32/152* (2017.08); *C08G 61/122* (2013.01);
(Continued)

(58) Field of Classification Search
None
See application file for complete search history.

(56) References Cited

U.S. PATENT DOCUMENTS

2010/0327271 A1* 12/2010 Uetani .................. B82Y 10/00
257/40
2013/0092912 A1    4/2013 You

FOREIGN PATENT DOCUMENTS

| CA | 2 781 316 A1 | 5/2011 |
| CN | 103642004 A | 3/2014 |
| CN | 103804650 A | 5/2014 |

OTHER PUBLICATIONS

Junxiang Zhang, et al.,"Controllable Direct Arylation: Fast Route to Symmetrical and Unsymmetrical 4,7-Diaryl-5,6-difluoro-2,1,3-benzothiadiazole Derivatives for Organic Optoelectronic Materials", Journal of the American Chemical Society, 2013 American Chemical Society, Published: Oct. 28, 2013, dx.doi.org/10.1021/ja4095878 | J. Am. Chem. Soc. 2013, 135, 16376-16379, pubs.acs.org/JACS.

(Continued)

*Primary Examiner* — Richard A Huhn
(74) *Attorney, Agent, or Firm* — Nath, Goldberg & Meyer; Joshua B. Goldberg

(57) ABSTRACT

The present subject matter relates to a formulation comprising an organic solvent, a fullerene, and a conjugated polymer, wherein a solution of the conjugated polymer exhibits a peak optical absorption spectrum red shift of at least 100 nm when the conjugated polymer solution is cooled from 120° C. to room temperature, and wherein the fullerene is not phenyl-C71-butyric-acid-methyl-ester (PC71BM). The present subject matter further relates to the use of a formulation as described above further characterized in that the fullerene is not phenyl-C61-butyric-acid-methyl-ester (PC61BM).

23 Claims, 4 Drawing Sheets

(51) Int. Cl.

| | | |
|---|---|---|
| *C09D 165/00* | (2006.01) | |
| *H01L 51/00* | (2006.01) | |
| *C09D 7/61* | (2018.01) | |
| *C09D 11/102* | (2014.01) | |
| *C09D 11/52* | (2014.01) | |
| *C08K 3/04* | (2006.01) | |
| *C01B 32/152* | (2017.01) | |
| *H01L 51/42* | (2006.01) | |
| *H01L 51/05* | (2006.01) | |

(52) U.S. Cl.
CPC ......... *C08G 61/123* (2013.01); *C08G 61/126* (2013.01); *C08K 3/045* (2017.05); *C09D 7/61* (2018.01); *C09D 11/102* (2013.01); *C09D 11/52* (2013.01); *C09D 165/00* (2013.01); *H01L 51/0034* (2013.01); *H01L 51/0043* (2013.01); *H01L 51/0047* (2013.01); *C08G 2261/12* (2013.01); *C08G 2261/124* (2013.01); *C08G 2261/146* (2013.01); *C08G 2261/1412* (2013.01); *C08G 2261/314* (2013.01); *C08G 2261/3223* (2013.01); *C08G 2261/3225* (2013.01); *C08G 2261/3246* (2013.01); *C08G 2261/364* (2013.01); *C08G 2261/414* (2013.01); *C08G 2261/51* (2013.01); *C08G 2261/91* (2013.01); *C08G 2261/92* (2013.01); *C08L 65/00* (2013.01); *C08L 2203/206* (2013.01); *H01L 51/0566* (2013.01); *H01L 51/424* (2013.01); *H01L 51/4253* (2013.01); *Y02E 10/549* (2013.01); *Y02P 70/521* (2015.11)

(56) References Cited

OTHER PUBLICATIONS

Huaxing Zhou, et al, "Development of Fluorinated Benzothiadiazole as a Structural Unit for a Polymer Solar Cell of 7% Efficiency", Angew. Chem. Int. Ed. 2011, 50, 2995 -2998, (c) 2011 Wiley-VCH Verlag GmbH & Co. KGaA, Weinheim, www.angewandte.org.

Yong Zhang, "Increased open circuit voltage in fluorinated benzothiadiazole-based alternating conjugated polymers", Chem. Commun., 2011, 47, 11026-11028.

* cited by examiner

A                                    B

POLYMER/FULLERENE FORMATIONS AND THEIR USE IN ELECTRONIC/PHOTONIC DEVICES

RELATED APPLICATIONS

This is a National Phase Application filed under 35 U.S.C. 371 as a national stage of PCT/CN2014/095053, filed Dec. 26, 2014, an application claiming the benefit of provisional U.S. Patent Application No. 61/964,172 filed Dec. 26, 2013, which was filed by the inventor hereof and is incorporated by reference herein in its entirety.

TECHNICAL FIELD

The present subject matter relates to novel polymer/fullerene formulations, methods for their preparation and intermediates used therein, the use of such formulations as semiconductors in organic electronic (OE) devices, especially in organic photovoltaic (OPV) and organic field-effect transistor (OFET) devices, and to OE and OPV devices made from these formulations.

BACKGROUND

In recent years there has been growing interest in the use of organic semiconductors, including conjugated polymers, for various electronic applications.

One particular area of importance is the field of organic photovoltaics. Organic semiconductors (OSCs) have found use in OPV as they allow devices to be manufactured by solution-processing techniques such as spin casting and printing. Solution processing can be carried out cheaper and on a larger scale compared to the evaporative techniques used to make inorganic thin film devices. State-of-the-art OPV cells consist of a blend film of a conjugated polymer and a fullerene derivative, which function as an electron donor and an electron acceptor, respectively. In order to achieve highly efficient OPVs, it is important to optimize both the polymer (donor) and fullerene (acceptor) components and to find a material combination yielding an optimal bulk heterojunction (BHJ) morphology that supports efficient exciton harvesting and charge transport properties. Recent improvements in the efficiencies of single-junction OPVs (efficiency ~8-9%) have largely been due to the development of low-band-gap polymers, which are defined as polymers with an absorption onset of at least 750 nm or more and with a band-gap of 1.65 eV or less. For example, poly(3-hexylthiophene) (P3HT), a low-performance OPV polymer having a band-gap of ~1.9 eV, is not considered to be a state-of-the-art polymer for OPVs.

The low-band-gap polymer materials and the polymer/fullerene formulations suggested in the prior art for use in OPVs still suffer from certain drawbacks. High-efficiency (>8%) OPVs can be achieved using many different low-band-gap polymers, but all are constrained to use with a specific fullerene, phenyl-C71-butyric-acid-methyl-ester ($PC_{71}BM$). $PC_{71}BM$ is commercially unacceptable because it is extremely expensive ($325/100 mg) and contains three isomers that are practically impossible to separate. The prior art has indicated that the morphology and performance of the reported high-efficiency, low-band-gap polymers is sensitive to the choice of fullerenes, making the use of $PC_{71}BM$ specifically of critical importance. Replacing $PC_{71}BM$ with another (cheaper) fullerene derivative, such as $PC_{61}BM$ or a non-PCBM fullerene, was previously found to decrease the OPV efficiency from 9.2% to 6-7%.

Though many low band-gap donor polymers have emerged, PC71BM is still the dominant fullerene acceptor, and thus, the progress in OPVs to-date is "one-dimensional" from a materials perspective. The development of polymer/fullerene material systems having morphology which is insensitive to the choice of fullerene significantly increases the degrees of freedom for optimizing polymer/fullerene combinations and exploring many different fullerene derivatives in order to achieve the best OPV performance.

Polymer thieno[3,4-b]thiophene/benzodithiophene (PTB7), described in the prior art, can achieve 9.2% efficiency when combined with the expensive fullerene derivative, $PC_{71}BM$. The structure of PTB7 is

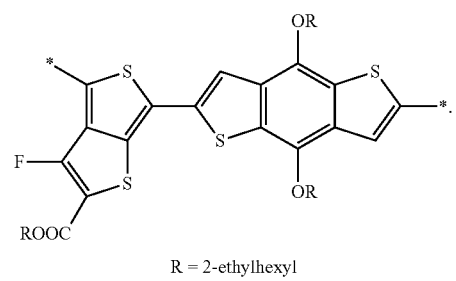

R = 2-ethylhexyl

Replacing $PC_{71}BM$ with a cheaper fullerene $PC_{61}BM$ decreases the OPV efficiency to 6.5%. A slight change in the substitution group of fullerene, such as changing $PC_{71}BM$ to $PC_{71}PM$, which is only one carbon shorter than $PC_{71}BM$, causes a dramatic decrease in OPV efficiency to ~1%. State-of-the-art OPV polymers, such as PTB7, are extremely sensitive to the choice of fullerene used, and therefore high-efficiency OPV can only be achieved with $PC_{71}BM$.

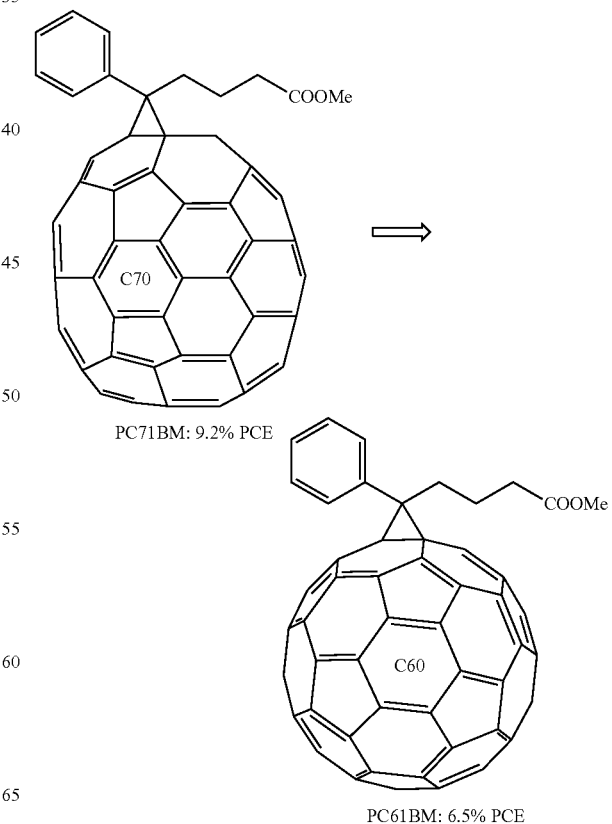

PC71BM: 9.2% PCE

PC61BM: 6.5% PCE

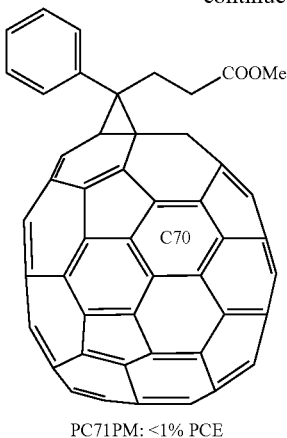

PC71PM: <1% PCE

The aim of the presently claimed subject matter is to provide polymer/fullerene formulations for use as organic semiconducting materials that do not have the drawbacks of the prior art materials as described above, are easy to synthesize, especially by methods suitable for mass production, and show advantageous properties, especially for OPV use, as described above.

Another aim of the presently claimed subject matter is to extend the pool of fullerene materials that can be matched with high-performance, low-band-gap polymers to produce highly efficient OPVs. In this regard, it is important to develop polymer/fullerene material systems whose morphology and performance is insensitive to the choice of fullerenes.

SUMMARY

The presently claimed subject matter relates to a formulation comprising an organic solvent, a fullerene, and a conjugated polymer, wherein a solution of the conjugated polymer exhibits a peak optical absorption spectrum red shift of at least 100 nm when the conjugated polymer solution is cooled from 120° C. to room temperature, and wherein the fullerene is not phenyl-C71-butyric-acid-methyl-ester (PC71BM).

The presently claimed subject matter further relates to the use of a formulation as described above and below wherein the fullerene is not phenyl-C61-butyric-acid-methyl-ester (PC61BM).

The presently claimed subject matter further relates to the use of a formulation as described above and below as a coating or printing ink, especially for the preparation of OE devices and rigid or flexible organic photovoltaic (OPV) cells and devices.

The presently claimed subject matter further relates to an OE device prepared from a formulation as described above and below. The OE devices contemplated in this regard include, without limitation, organic field effect transistors (OFET), integrated circuits (IC), thin film transistors (TFT), Radio Frequency Identification (RFID) tags, organic light emitting diodes (OLED), organic light emitting transistors (OLET), electroluminescent displays, organic photovoltaic (OPV) cells, organic solar cells (O-SC), flexible OPVs and O-SCs, organic laser diodes (O-laser), organic integrated circuits (O-IC), lighting devices, sensor devices, electrode materials, photoconductors, photodetectors, electrophotographic recording devices, capacitors, charge injection layers, Schottky diodes, planarising layers, antistatic films, conducting substrates, conducting patterns, photoconductors, electrophotographic devices, organic memory devices, biosensors and biochips.

The formulations, methods, and devices of the presently claimed subject matter provide surprising improvements in the efficiency of OE devices and the production thereof. Unexpectedly, the performance, the lifetime, and the efficiency of the OE devices can be improved if these devices are achieved by using a formulation of the presently claimed subject matter. Furthermore, the formulation of the presently claimed subject matter provides an astonishingly high level of film forming. Especially, the homogeneity and the quality of the films can be improved. In addition thereto, the presently claimed subject matter enables a better solution for printing of OE devices, especially OPV devices.

BRIEF DESCRIPTION OF THE DRAWINGS

It should be understood that the drawings described above or below are for illustration purposes only. The drawings are not necessarily to scale, with emphasis generally being placed upon illustrating the principles of the present teachings. The drawings are not intended to limit the scope of the present teachings in any way.

DETAILED DESCRIPTION

Definitions

Figure 1:
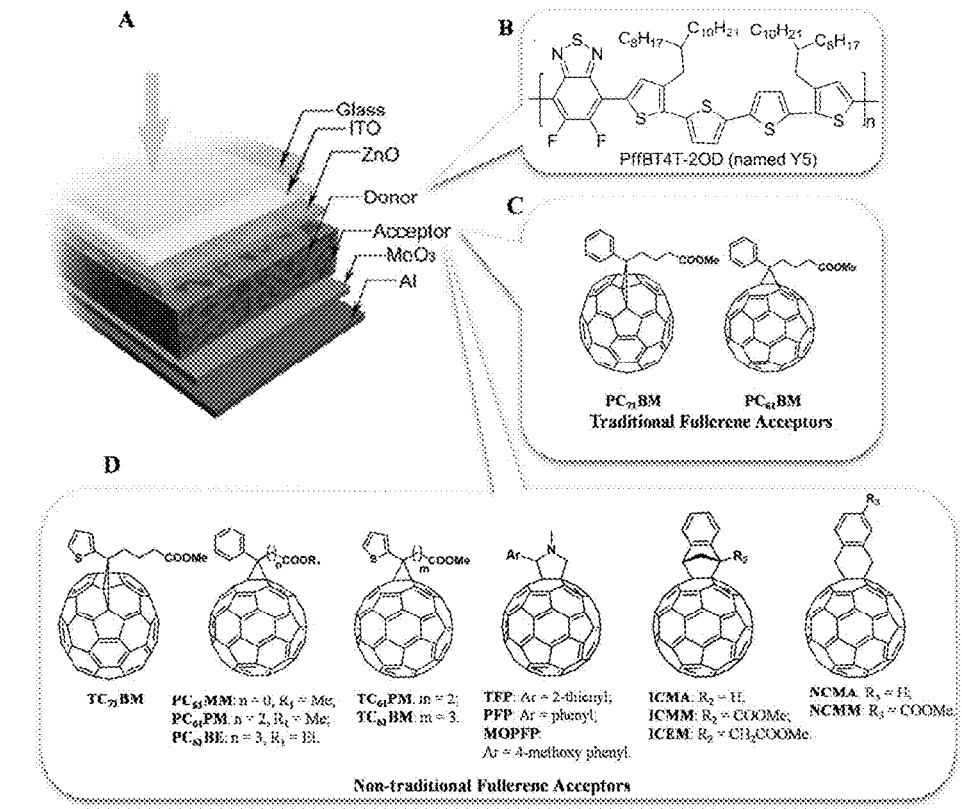
FIG. 1A is an illustration representing a bulk-heterojunction (BHJ) organic photovoltaic device (also known as a solar cell) structure, which can incorporate polymer and fullerene as its photoactive layer (respectively as donor and acceptor materials).
FIG. 1B shows the chemical structure of donor material polymer PffBT4T-2OD.
FIG. 1C shows the chemical structures of traditional fullerene acceptor materials $PC_{71}BM$ and $PC_{61}BM$.
FIG. 1D shows the chemical structures of non-traditional fullerene acceptor materials $TC_{71}BM$, $PC_{61}MM$, $PC_{61}PM$, $PC_{61}BE$, $TC_{61}PM$, $TC_{61}BM$, TFP, PFP, MOPFP, ICMA, ICMM, ICEM, NCMA, and NCMM.

Throughout the application, where compositions are described as having, including, or comprising specific components, or where processes are described as having, including, or comprising specific process steps, it is contemplated that compositions of the present teachings can also consist essentially of, or consist of, the recited components, and that the processes of the present teachings can also consist essentially of, or consist of, the recited process steps.

In the application, where an element or component is said to be included in and/or selected from a list of recited elements or components, it should be understood that the element or component can be any one of the recited elements or components, or the element or component can be selected from a group consisting of two or more of the recited elements or components. Further, it should be understood that elements and/or features of a composition, an apparatus, or a method described herein can be combined in a variety of ways without departing from the spirit and scope of the present teachings, whether explicit or implicit herein.

The use of the terms "include," "includes", "including," "have," "has," or "having" should be generally understood as open-ended and non-limiting unless specifically stated otherwise.

The use of the singular herein includes the plural (and vice versa) unless specifically stated otherwise. In addition, where the use of the term "about" is before a quantitative value, the present teachings also include the specific quantitative value itself, unless specifically stated otherwise. As used herein, the term "about" refers to a ±10% variation from the nominal value unless otherwise indicated or inferred.

It should be understood that the order of steps or order for performing certain actions is immaterial so long as the present teachings remain operable. Moreover, two or more steps or actions may be conducted simultaneously.

As used herein, a "p-type semiconductor material" or a "donor" material refers to a semiconductor material, for example, an organic semiconductor material, having holes as the majority current or charge carriers. In some embodiments, when a p-type semiconductor material is deposited on a substrate, it can provide a hole mobility in excess of about $10^{-5}$ cm/Vs. In the case of field-effect devices, a p-type semiconductor also can exhibit a current on/off ratio of greater than about 10.

As used herein, an "n-type semiconductor material" or an "acceptor" material refers to a semiconductor material, for example, an organic semiconductor material, having electrons as the majority current or charge carriers. In some embodiments, when an n-type semiconductor material is deposited on a substrate, it can provide an electron mobility in excess of about $10^{-5}$ cm/Vs. In the case of field-effect devices, an n-type semiconductor also can exhibit a current on/off ratio of greater than about 10.

As used herein, "mobility" refers to a measure of the velocity with which charge carriers, for example, holes (or units of positive charge) in the case of a p-type semiconductor material and electrons (or units of negative charge) in the case of an n-type semiconductor material, move through the material under the influence of an electric field. This parameter, which depends on the device architecture, can be measured using a field-effect device or space-charge limited current measurements.

As used herein, a compound can be considered "ambient stable" or "stable at ambient conditions" when a transistor incorporating the compound as its semiconducting material exhibits a carrier mobility that is maintained at about its initial measurement when the compound is exposed to ambient conditions, for example, air, ambient temperature, and humidity, over a period of time. For example, a compound can be described as ambient stable if a transistor incorporating the compound shows a carrier mobility that does not vary more than 20% or more than 10% from its initial value after exposure to ambient conditions, including, air, humidity and temperature, over a 3 day, 5 day, or 10 day period.

As used herein, fill factor (FF) is the ratio (given as a percentage) of the actual maximum obtainable power, (Pm or Vmp*Jmp), to the theoretical (not actually obtainable) power, (Jsc*Voc). Accordingly, FF can be determined using the equation:

$$FF=(V\text{mp}*J\text{mp})/(J\text{sc}*V\text{oc})$$

where Jmp and Vmp represent the current density and voltage at the maximum power point (Pm), respectively, this point being obtained by varying the resistance in the circuit until J*V is at its greatest value; and Jsc and Voc represent the short circuit current and the open circuit voltage, respectively. Fill factor is a key parameter in evaluating the performance of solar cells. Commercial solar cells typically have a fill factor of about 0.60% or greater.

As used herein, the open-circuit voltage (Voc) is the difference in the electrical potentials between the anode and the cathode of a device when there is no external load connected.

As used herein, the power conversion efficiency (PCE) of a solar cell is the percentage of power converted from absorbed light to electrical energy. The PCE of a solar cell can be calculated by dividing the maximum power point (Pm) by the input light irradiance (E, in W/m2) under standard test conditions (STC) and the surface area of the solar cell (Ac in m2). STC typically refers to a temperature of 25° C. and an irradiance of 1000 W/m2 with an air mass 1.5 (AM 1.5) spectrum.

As used herein, a component (such as a thin film layer) can be considered "photoactive" if it contains one or more compounds that can absorb photons to produce excitons for the generation of a photocurrent.

As used herein, "solution-processable" refers to compounds (e.g., polymers), materials, or compositions that can be used in various solution-phase processes including spin-coating, printing (e.g., inkjet printing, gravure printing, offset printing and the like), spray coating, electrospray coating, drop casting, dip coating, and blade coating.

As used herein, a "semicrystalline polymer" refers to a polymer that has an inherent tendency to crystallize at least partially either when cooled from a melted state or deposited from solution, when subjected to kinetically favorable conditions such as slow cooling, or low solvent evaporation rate and so forth. The crystallization or lack thereof can be readily identified by using several analytical methods, for example, differential scanning calorimetry (DSC) and/or X-ray diffraction (XRD).

As used herein, "annealing" refers to a post-deposition heat treatment to the semicrystalline polymer film in ambient or under reduced/increased pressure for a time duration of more than 100 seconds, and "annealing temperature" refers to the maximum temperature that the polymer film is exposed to for at least 60 seconds during this process of annealing. Without wishing to be bound by any particular theory, it is believed that annealing can result in an increase of crystallinity in the polymer film, where possible, thereby increasing field effect mobility. The increase in crystallinity can be monitored by several methods, for example, by comparing the differential scanning calorimetry (DSC) or X-ray diffraction (XRD) measurements of the as-deposited and the annealed films.

As used herein, a "polymeric compound" (or "polymer") refers to a molecule including a plurality of one or more repeating units connected by covalent chemical bonds. A polymeric compound can be represented by General Formula I:

$$*\text{-}(\text{-}(Ma)_x\text{-}(Mb)_y\text{-})_z*$$   General Formula I wherein each Ma and Mb is a repeating unit or monomer. The polymeric compound can have only one type of repeating unit as well as two or more types of different repeating units. When a polymeric compound has only one type of repeating unit, it can be referred to as a homopolymer. When a polymeric compound has two or more types of different repeating units, the term "copolymer" or "copolymeric compound" can be used instead. For example, a copolymeric compound can include repeating units where Ma and Mb represent two different repeating units. Unless specified otherwise, the assembly of the repeating units in the copolymer can be head-to-tail, head-to-head, or tail-to-tail. In addition, unless specified otherwise, the copolymer can be a random copolymer, an alternating copolymer, or a block copolymer. For example, General Formula I can be used to represent a copolymer of Ma and Mb having x mole fraction of Ma and y mole fraction of Mb in the copolymer, where the manner in which comonomers Ma and Mb is repeated can be alternating, random, regiorandom, regioregular, or in blocks, with up to z comonomers present. In addition to its composition, a polymeric compound can be further characterized by its degree of polymerization (n) and molar mass (e.g., number average molecular weight (M) and/or weight average molecular weight (Mw) depending on the measuring technique(s)).

As used herein, "halo" or "halogen" refers to fluoro, chloro, bromo, and iodo.

As used herein, "alkyl" refers to a straight-chain or branched saturated hydrocarbon group. Examples of alkyl groups include methyl (Me), ethyl (Et), propyl (e.g., n-propyl and z'-propyl), butyl (e.g., n-butyl, z'-butyl, sec-butyl, tert-butyl), pentyl groups (e.g., n-pentyl, z'-pentyl, -pentyl), hexyl groups, and the like. In various embodiments, an alkyl group can have 1 to 40 carbon atoms (i.e., C1-40 alkyl group), for example, 1-30 carbon atoms (i.e., C1-30 alkyl group). In some embodiments, an alkyl group can have 1 to 6 carbon atoms, and can be referred to as a "lower alkyl group." Examples of lower alkyl groups include methyl, ethyl, propyl (e.g., n-propyl and z'-propyl), and butyl groups (e.g., n-butyl, z'-butyl, sec-butyl, tert-butyl). In some embodiments, alkyl groups can be substituted as described herein. An alkyl group is generally not substituted with another alkyl group, an alkenyl group, or an alkynyl group.

As used herein, "alkenyl" refers to a straight-chain or branched alkyl group having one or more carbon-carbon double bonds. Examples of alkenyl groups include ethenyl, propenyl, butenyl, pentenyl, hexenyl, butadienyl, pentadienyl, hexadienyl groups, and the like. The one or more carbon-carbon double bonds can be internal (such as in 2-butene) or terminal (such as in 1-butene). In various embodiments, an alkenyl group can have 2 to 40 carbon atoms (i.e., C2-40 alkenyl group), for example, 2 to 20 carbon atoms (i.e., C2-20 alkenyl group). In some embodiments, alkenyl groups can be substituted as described herein. An alkenyl group is generally not substituted with another alkenyl group, an alkyl group, or an alkynyl group.

As used herein, a "fused ring" or a "fused ring moiety" refers to a polycyclic ring system having at least two rings where at least one of the rings is aromatic and such aromatic ring (carbocyclic or heterocyclic) has a bond in common with at least one other ring that can be aromatic or non-aromatic, and carbocyclic or heterocyclic. These polycyclic ring systems can be highly p-conjugated and optionally substituted as described herein.

As used herein, "heteroatom" refers to an atom of any element other than carbon or hydrogen and includes, for example, nitrogen, oxygen, silicon, sulfur, phosphorus, and selenium.

As used herein, "aryl" refers to an aromatic monocyclic hydrocarbon ring system or a polycyclic ring system in which two or more aromatic hydrocarbon rings are fused (i.e., having a bond in common with) together or at least one aromatic monocyclic hydrocarbon ring is fused to one or more cycloalkyl and/or cycloheteroalkyl rings. An aryl group can have 6 to 24 carbon atoms in its ring system (e.g., C6-24 aryl group), which can include multiple fused rings. In some embodiments, a polycyclic aryl group can have 8 to 24 carbon atoms. Any suitable ring position of the aryl group can be covalently linked to the defined chemical structure. Examples of aryl groups having only aromatic carbocyclic ring(s) include phenyl, 1-naphthyl (bicyclic), 2-naphthyl (bicyclic), anthracenyl (tricyclic), phenanthrenyl (tricyclic), pentacenyl (pentacyclic), and like groups. Examples of polycyclic ring systems in which at least one aromatic carbocyclic ring is fused to one or more cycloalkyl and/or cycloheteroalkyl rings include, among others, benzo derivatives of cyclopentane (i.e., an indanyl group, which is a 5,6-bicyclic cycloalkyl/aromatic ring system), cyclohexane (i.e., a tetrahydronaphthyl group, which is a 6,6-bicyclic cycloalkyl/aromatic ring system), imidazoline (i.e., a benzimidazolinyl group, which is a 5,6-bicyclic cycloheteroalkyl/aromatic ring system), and pyran (i.e., a chromenyl group, which is a 6,6-bicyclic cycloheteroalkyl/aromatic ring system). Other examples of aryl groups include benzodioxanyl, benzodioxolyl, chromanyl, indolinyl groups, and the like. In some embodiments, aryl groups can be substituted as described herein. In some embodiments, an aryl group can have one or more halogen substituents, and can be referred to as a "haloaryl" group. Perhaloaryl groups, i.e., aryl groups where all of the hydrogen atoms are replaced with halogen atoms (e.g., —C6F5), are included within the definition of "haloaryl." In certain embodiments, an aryl group is substituted with another aryl group and can be referred to as a biaryl group. Each of the aryl groups in the biaryl group can be substituted as disclosed herein.

As used herein, "heteroaryl" refers to an aromatic monocyclic ring system containing at least one ring heteroatom selected from oxygen (O), nitrogen (N), sulfur (S), silicon (Si), and selenium (Se) or a polycyclic ring system where at least one of the rings present in the ring system is aromatic and contains at least one ring heteroatom. Polycyclic heteroaryl groups include those having two or more heteroaryl rings fused together, as well as those having at least one monocyclic heteroaryl ring fused to one or more aromatic carbocyclic rings, non-aromatic carbocyclic rings, and/or non-aromatic cycloheteroalkyl rings. A heteroaryl group, as a whole, can have, for example, 5 to 24 ring atoms and contain 1-5 ring heteroatoms (i.e., 5-20 membered heteroaryl group). The heteroaryl group can be attached to the defined chemical structure at any heteroatom or carbon atom that results in a stable structure. Generally, heteroaryl rings do not contain O—O, S—S, or S—O bonds. However, one or more N or S atoms in a heteroaryl group can be oxidized (e.g., pyridine Noxide thiophene S-oxide, thiophene S,S-dioxide). Examples of heteroaryl groups include, for example, the 5- or 6-membered monocyclic and 5-6 bicyclic ring systems shown below: where T is O, S, NH, N-alkyl, N-aryl, N-(arylalkyl) (e.g., N-benzyl), SiH2, SiH(alkyl), Si(alkyl)2, SiH(arylalkyl), Si(arylalkyl)2, or Si(alkyl)(arylalkyl). Examples of such heteroaryl rings include pyrrolyl, furyl, thienyl, pyridyl, pyrimidyl, pyridazinyl, pyrazinyl, triazolyl, tetrazolyl, pyrazolyl, imidazolyl, isothiazolyl, thiazolyl, thiadiazolyl, isoxazolyl, oxazolyl, oxadiazolyl, indolyl, isoindolyl, benzofuryl, benzothienyl, quinolyl, 2-methylquinolyl, isoquinolyl, quinoxalyl, quinazolyl, benzotriazolyl, benzimidazolyl, benzothiazolyl, benzisothiazolyl, benzisoxazolyl, benzoxadiazolyl, benzoxazolyl, cinnolinyl, 1H-indazolyl, 2H-indazolyl, indolizinyl, isobenzofuryl, naphthyridinyl, phthalazinyl, pteridinyl, purinyl, oxazolopyridinyl, thiazolopyridinyl, imidazopyridinyl, furopyridinyl, thienopyridinyl, pyridopyrimidinyl, pyridopyrazinyl, pyridopyrdazinyl, thienothiazolyl, thienoxazolyl, thienoimidazolyl groups, and the like. Further examples of heteroaryl groups include 4,5,6,7-tetrahydroindolyl, tetrahydroquinolinyl, benzothienopyridinyl, benzofuropyridinyl groups, and the like. In some embodiments, heteroaryl groups can be substituted as described herein.

In the presently claimed subject matter, one or more of the above aims can be achieved by providing a formulation comprising a family of conjugated polymers containing the following building block:

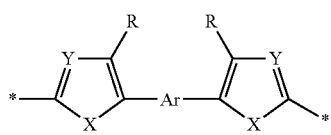

wherein Ar, R, X, Y are as defined herein.

It was surprisingly found that such polymers show a dramatic red shift (>100 nm) in the peak of its optical absorption spectrum when in solution and cooled from high temperatures (e.g., 120° C.) to room temperature. Surprisingly and beneficially, polymers based on such building blocks and with such optical properties were found to form optimal polymer/fullerene morphology when combined with many different fullerenes other than $PC_{71}BM$. An unexpected benefit of using such building blocks is that the morphology of resultant polymer/fullerene blends is insensitive to the choice of fullerene. As a result, optimal polymer/fullerene morphology and high-efficiency OPVs can be achieved with many options of fullerenes. Combining such a polymer with a new fullerene, $TC_{71}BM$, led to OPV efficiency of 10.8%, which is a new world record reported to date.

It was also surprisingly found the family of polymers comprising the shown building block enables highly efficient OPVs (9.5-10.8%) when combined with many different options of fullerenes, including non-traditional fullerenes and fullerenes cheaper than $PC_{71}BM$. In contrast to the low-band-gap polymers of the prior art that only work well when combined with $PC_{71}BM$, the polymers and formulations in the presently claimed subject matter work well with many fullerenes and led to multiple cases of record-breaking OPVs.

Polymer solutions are typically prepared in solvents such as dichlorobenzene at a concentration of 0.1 mg/mL. Upon heating to 120° C., a polymer (FIG. 1B) of the present teaching shows UV-Vis absorption peak at 550 nm (dotted line in FIG. 2A). Cooling of the polymer solution to room temperature led to a dramatic shift of the peak absorption to about 740 nm (dashed line in FIG. 2A).

Figure 5:
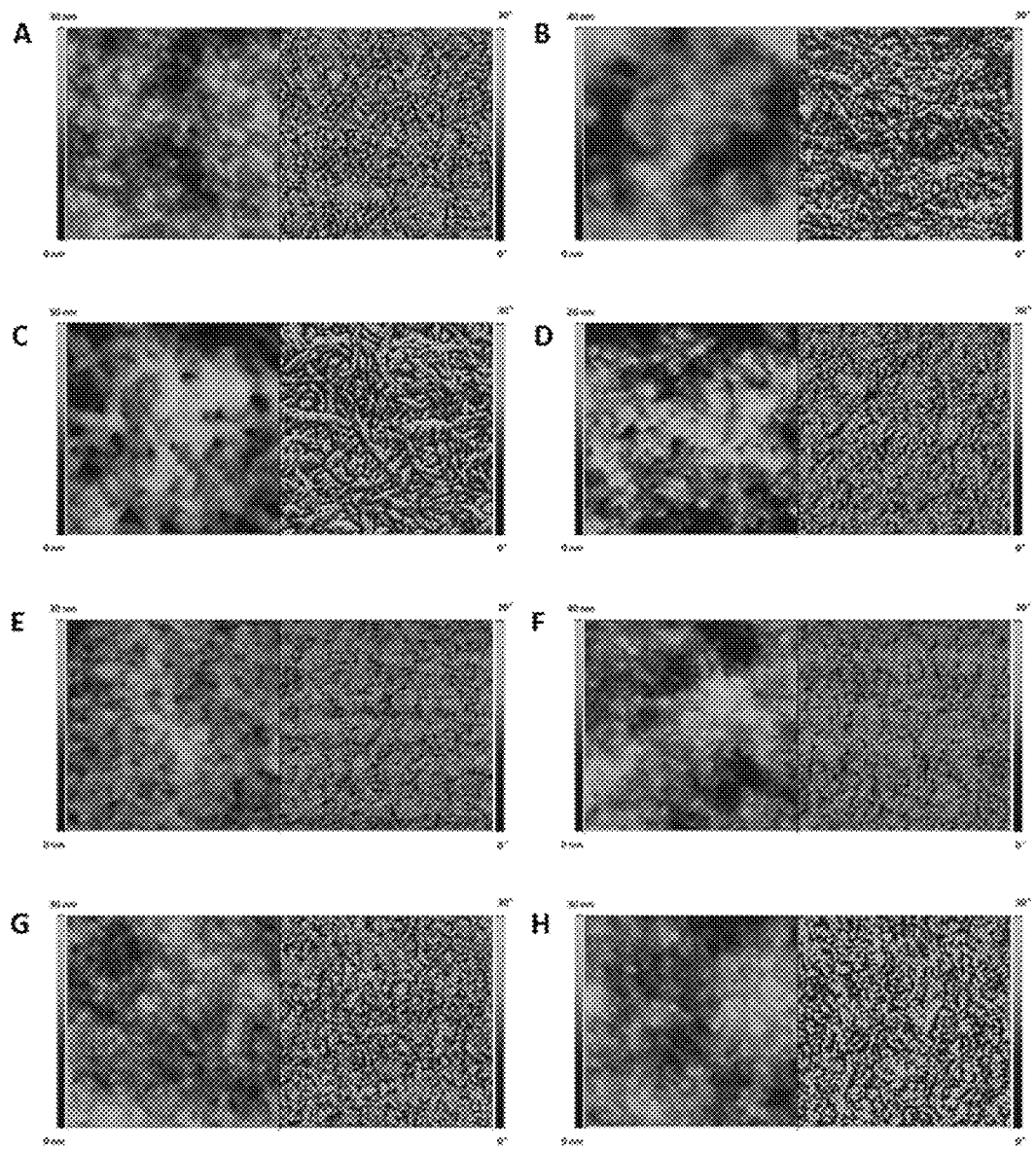
FIG. 5A-5H display the AFM surface topography and phase images of blend films containing different fullerenes and a polymer of the present teaching. (A) PFFBT4T-2OD/$TC_{71}BM$; (B) PFFBT4T-2OD/$PC_{71}BM$; (C) PFFBT4T-2OD/$PC_{61}PM$; (D) PFFBT4T-2OD/$TC_{61}PM$; (E) PFFBT4T-2OD/MOPFP; (F) PFFBT4T-2OD/NCMA; (G) PFFBT4T-2OD/NCMM; (H) PFFBT4T-2OD/ICMM.

Detailed examination of the optical absorption spectrum of the polymer in the present teaching indicates a new and dramatically shifted absorption peak at 730 nm. Such a peak was previously observed as a "shoulder" of the main absorption peak at 650 nm and was called a "vibronic shoulder", the extent of which indicates the extent of pi-pi stacking of the polymer. In contrast to prior art examples wherein the "vibronic peak" was lower in height compared to the main peak, the polymer in the presently claimed subject matter was surprisingly found to exhibit a much stronger "vibronic peak" than the original peak at 650 nm. Unexpected results showed that polymers with certain alkyl chains and molecular weights can exhibit such optical properties, which are then related to excellent ability in forming polymer/fullerene morphology and achieving high-efficiency OPV devices. Polymers in the present teaching are further characterized in that a second and new absorption peak appears at the right end of the absorption spectrum and that the intensity of this second peak grows with a decreased temperature and reaches a maximum value higher than that of the original peak at room temperature Surprisingly and beneficially, polymers exhibiting such absorption properties tend to form optimal polymer/fullerene morphology with many different fullerenes, as evidenced by the AFM images of many different polymer/fullerene films (FIG. 5). As a result of the excellent polymer/fullerene morphology based on such polymers, high-efficiency (9.5-10.8%) OPV devices were achieved using many fullerenes other than $PC_{71}BM$.

Formulations of the present teachings can exhibit semiconductor behavior such as optimized light absorption/charge separation in a photovoltaic device; charge transport/recombination/light emission in a light-emitting device; and/or high carrier mobility and/or good current modulation characteristics in a field-effect device. In addition, the present formulations can possess certain processing advantages such as solution-processability and/or good stability (e.g., air stability) in ambient conditions. The formulations of the present teachings can be used to prepare either p-type (donor or hole-transporting), n-type (acceptor or electron-transporting), or ambipolar semiconductor materials, which in turn can be used to fabricate various organic or hybrid optoelectronic articles, structures and devices, including organic photovoltaic devices and organic light-emitting transistors.

In one exemplary embodiment, the present subject matter relates to a formulation comprising an organic solvent, a fullerene, and a conjugated polymer, wherein a solution of the conjugated polymer exhibits a peak optical absorption spectrum red shift of at least 100 nm when the conjugated polymer solution is cooled from 120° C. to room temperature, and wherein the fullerene is not phenyl-C71-butyric-acid-methyl-ester (PC71BM).

In another exemplary embodiment, the present subject matter further relates to the use of a formulation as described above further characterized in that the fullerene is not phenyl-C61-butyric-acid-methyl-ester (PC61BM).

In one embodiment in this regard, the conjugated polymer can comprise one or more repeating units of the following formula:

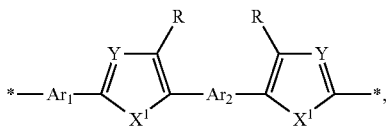

wherein each Y is independently selected from the group consisting of N, C—H, and C—R1, wherein R1 is selected from the group consisting of C1-30 straight-chain and branched alkyl groups;

each $X^1$ is independently selected from the group consisting of S and Se;

each R is independently selected from the group consisting of straight-chain, branched, and cyclic alkyl with 2-40 C atoms, wherein one or more non-adjacent C atoms are optionally replaced by —O—, —S—, —C(O)—, —C(O—)—O—, —O—C(O)—, —O—C(O)—O—, —CR$^0$=CR$^{00}$—, or —C≡—, and wherein one or more H atoms are optionally replaced by F, Cl, Br, I, or CN or denote aryl, heteroaryl, aryloxy, heteroaryloxy, arylcarbonyl, heteroarylcarbonyl, arylcarbonyloxy, heteroarylcarbonyloxy, aryloxycarbonyl, or heteroaryloxycarbonyl having 4 to 30 ring atoms unsubstituted or substituted by one or more non-aromatic groups, wherein $R^0$ and $R^{00}$ are independently a straight-chain, branched, or cyclic alkyl group; and each $Ar_1$ and $Ar_2$ is independently selected from the group consisting of unsubstituted or substituted monocyclic, bicyclic, and polycyclic arylene, and monocyclic, bicyclic, and polycyclic heteroarylene, wherein each $Ar_1$ and $Ar_2$ may contain one to five of said arylene or heteroarylene each of which may be fused or linked.

In another embodiment, the conjugated polymer is not poly(3-hexylthiophene-2,5-diyl) (P3HT).

In another exemplary embodiment, the present subject matter relates to a formulation comprising an organic solvent, a fullerene, and a conjugated polymer, wherein a solution of the conjugated polymer exhibits a peak optical absorption spectrum red shift of at least 100 nm when the conjugated polymer solution is cooled from 120° C. to room temperature, wherein the fullerene is not phenyl-C71-butyric-acid-methyl-ester (PC71BM), wherein the conjugated polymer comprises one or more repeating units of the following formula:

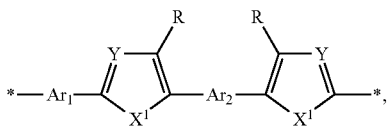

wherein each Y is independently selected from the group consisting of N, C—H, and C—R1, wherein R1 is selected from the group consisting of C1-30 straight-chain and branched alkyl groups;

each $X^1$ is independently selected from the group consisting of S and Se;

each R is independently selected from the group consisting of straight-chain, branched, and cyclic alkyl with 2-40 C atoms, wherein one or more non-adjacent C atoms are optionally replaced by —O—, —S—, —C(O)—, —C(O—)—O—, —O—C(O)—, —O—C(O)—O—, —CR$^0$=CR$^{00}$—, or —C≡C—, and wherein one or more H atoms are optionally replaced by F, Cl, Br, I, or CN or denote aryl, heteroaryl, aryloxy, heteroaryloxy, arylcarbonyl, heteroarylcarbonyl, arylcarbonyloxy, heteroarylcarbonyloxy, aryloxycarbonyl, or heteroaryloxycarbonyl having 4 to 30 ring atoms unsubstituted or substituted by one or more non-aromatic groups, wherein $R^0$ and $R^{00}$ are independently a straight-chain, branched, or cyclic alkyl group;

each $Ar_1$ and $Ar_2$ is independently selected from the group consisting of unsubstituted or substituted monocyclic, bicyclic, and polycyclic arylene, and monocyclic, bicyclic, and polycyclic heteroarylene, wherein each $Ar_1$ and $Ar_2$ may contain one to five of said arylene or heteroarylene each of which may be fused or linked; and wherein the conjugated polymer is not poly(3-hexylthiophene-2,5-diyl) (P3HT);

In another exemplary embodiment, the formulation is further characterized in that the fullerene is not phenyl-C61-butyric-acid-methyl-ester (PC61BM).

In some embodiments, the formulation is further characterized in that the conjugated polymer comprises one or more repeating units selected from the group consisting of:

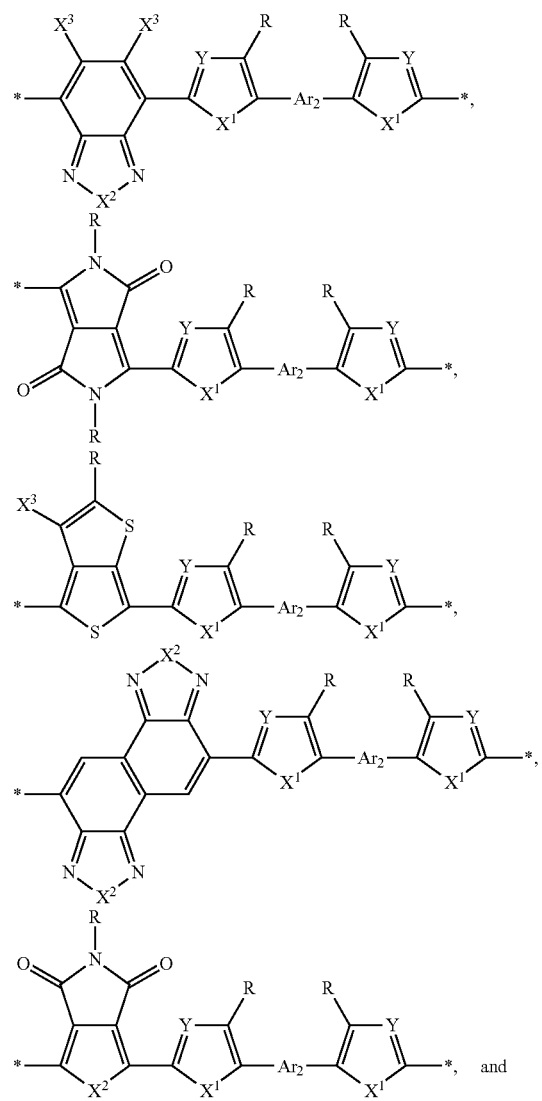

-continued

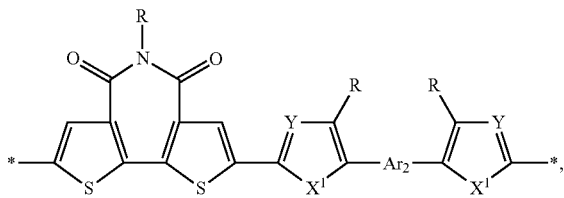

wherein each $X^2$ is independently selected from the group consisting of S, Se, O, and N—R2, wherein R2 is selected from C1-30 straight-chain or branched alkyl groups;

each $X^3$ is independently selected from the group consisting of F, Cl, H, and Br; and each $Ar_2$ is independently selected from the group consisting of monocyclic, bicyclic, and polycyclic arylene, and monocyclic, bicyclic, and polycyclic heteroarylene, wherein each $Ar_2$ may contain one to five of said arylene or heteroarylene each of which may be fused or linked.

In some embodiments, the formulation is further characterized in that the conjugated polymer comprises one or more repeating units selected from the group consisting of:

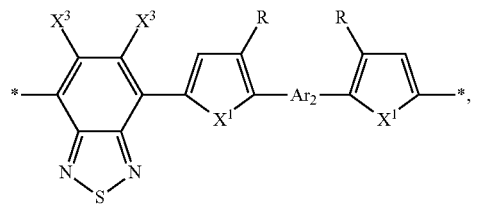

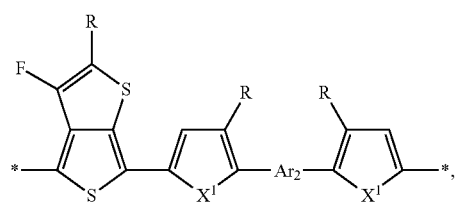

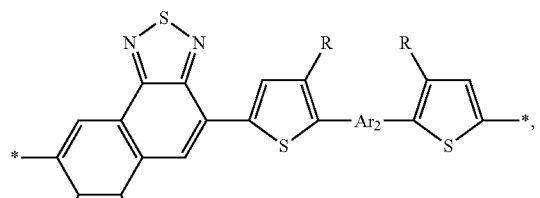

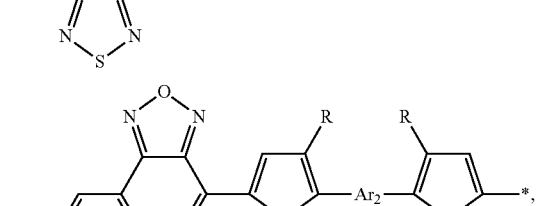

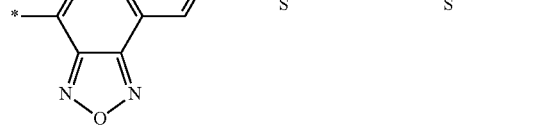

-continued

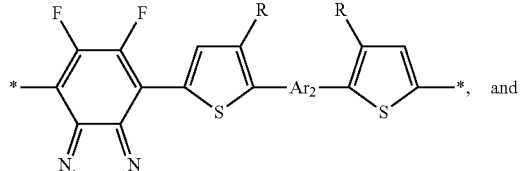

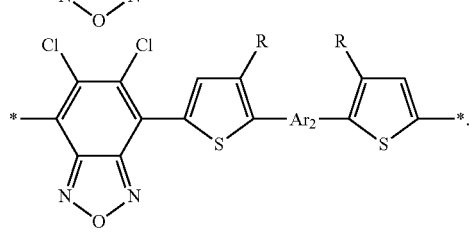

wherein each $X^1$ is independently selected from the group consisting of S and Se;

each $X^3$ is independently selected from the group consisting of Cl and F;

each R is independently selected from the group consisting of $C_{8-23}$ branched alkyl groups; and each $Ar_2$ is independently selected from the group consisting of substituted or unsubstituted bithiophene.

In some embodiments, the formulation is further characterized in that the conjugated polymer comprises one or more repeating units with a formula of:

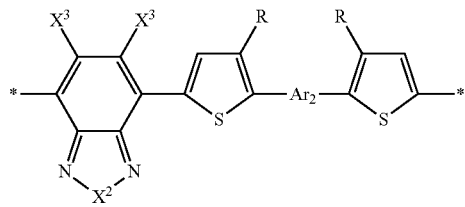

wherein each $X^2$ is independently selected from the group consisting of S and O;

each $X^3$ is independently selected from the group consisting of Cl and F;

each R is independently selected from the group consisting of $C_{17-23}$ branched alkyl groups; and each $Ar_2$ is independently selected from the group consisting of substituted or unsubstituted bithiophene.

In some embodiments, the formulation is further characterized in that the conjugated polymer comprises one or more repeating units with a formula of:

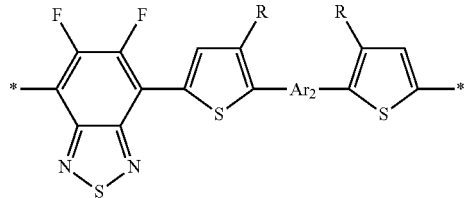

wherein each R is independently selected from the group consisting of $C_{17-23}$ branched alkyl groups; and each $Ar_2$ is independently selected from the group consisting of substituted or unsubstituted bithiophene.

In some embodiments, the formulation is further characterized in that the conjugated polymer has an optical bandgap of 1.8 eV or lower, or more preferably, 1.65 eV or lower.

In a further embodiment, the fullerene useful herein can be selected from the group consisting of:
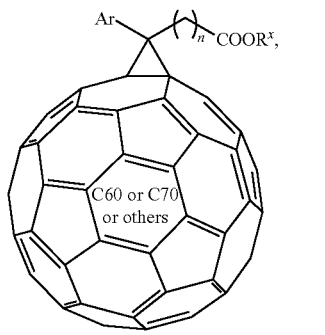
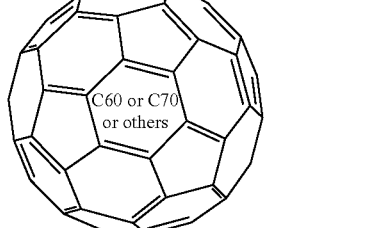
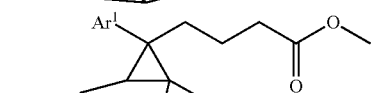
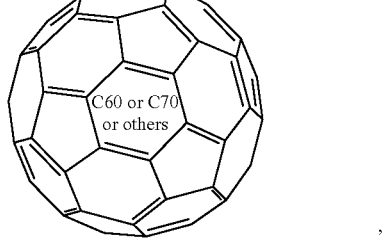
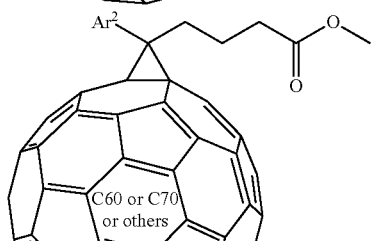
,
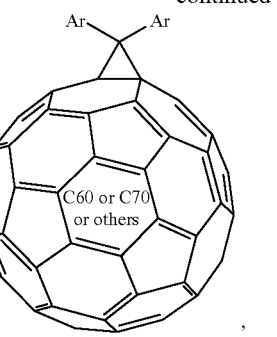
,
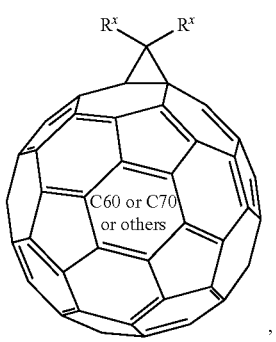
,
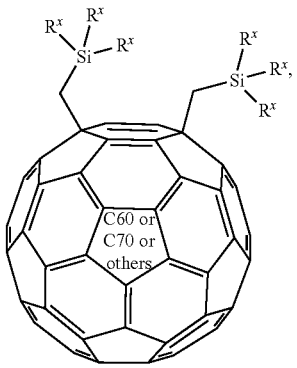
,
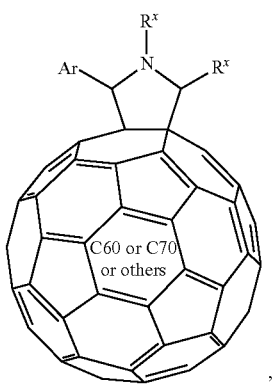
,

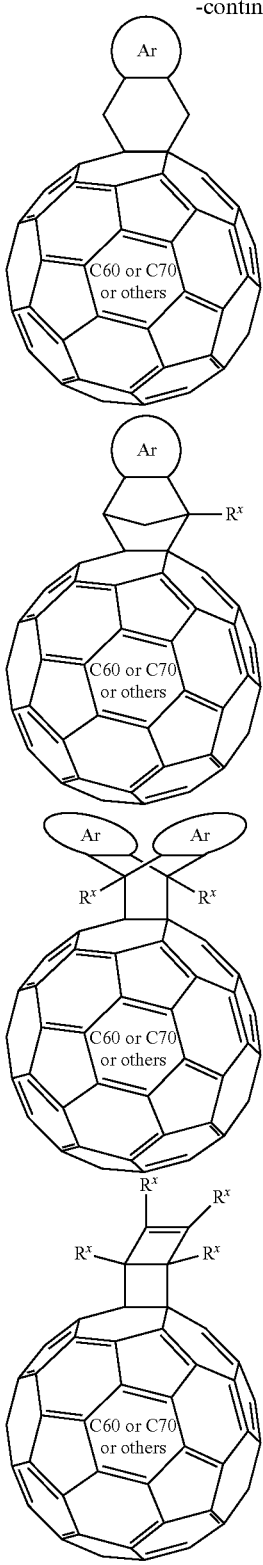

, and

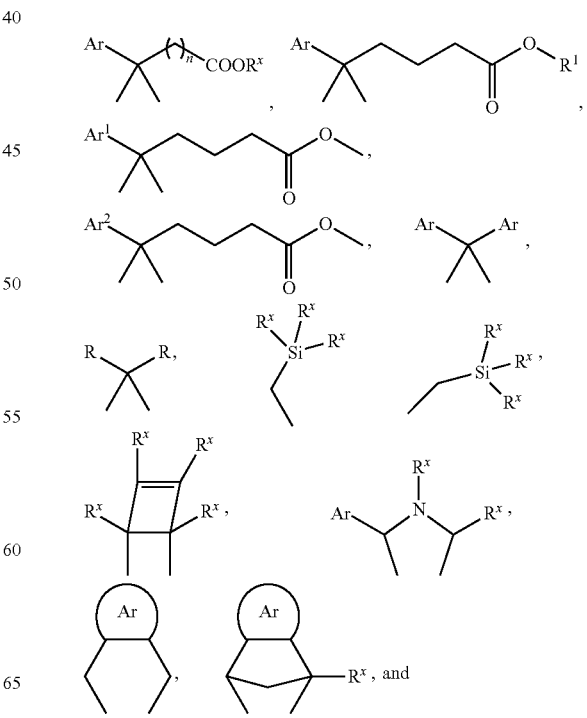

wherein each n=1, 2, 4, 5, or 6;

each Ar is independently selected from the group consisting of monocyclic, bicyclic, and polycyclic arylene, and monocyclic, bicyclic, and polycyclic heteroarylene, wherein each Ar may contain one to five of said arylene or heteroarylene each of which may be fused or linked;

each $R^x$ is independently selected from the group consisting of Ar, straight-chain, branched, and cyclic alkyl with 2-40 C atoms, wherein one or more non-adjacent C atoms are optionally replaced by —O—, —S—, —C(O)—, —C(O—)—O—, —O—C(O)—, —O—C(O)—O—, —CR$^o$=CR$^{oo}$—, or —C≡C—, and wherein one or more H atoms are optionally replaced by F, Cl, Br, I, or CN or denote aryl, heteroaryl, aryloxy, heteroaryloxy, arylcarbonyl, heteroarylcarbonyl, arylcarbonyloxy, heteroarylcarbonyloxy, aryloxycarbonyl, or heteroaryloxycarbonyl having 4 to 30 ring atoms unsubstituted or substituted by one or more non-aromatic groups, wherein $R^o$ and $R^{oo}$ are independently a straight-chain, branched, or cyclic alkyl group;

each $R^1$ is independently selected from the group consisting of straight-chain, branched, and cyclic alkyl with 2-40 C atoms, wherein one or more non-adjacent C atoms are optionally replaced by —O—, —S—, —C(O)—, —C(O—)—O—, —O—C(O)—, —O—C(O)—O—, —CR$^o$=CR$^{oo}$—, or —C≡C—, and wherein one or more H atoms are optionally replaced by F, Cl, Br, I, or CN or denote aryl, heteroaryl, aryloxy, heteroaryloxy, arylcarbonyl, heteroarylcarbonyl, arylcarbonyloxy, heteroarylcarbonyloxy, aryloxycarbonyl, or heteroaryloxycarbonyl having 4 to 30 ring atoms unsubstituted or substituted by one or more non-aromatic groups, wherein the number of carbon that $R^1$ contains is larger than 1, wherein $R^o$ and $R^{oo}$ are independently a straight-chain, branched, or cyclic alkyl group;

each $Ar^1$ is independently selected from the group consisting of monocyclic, bicyclic and polycyclic heteroaryl groups, wherein each $Ar^1$ may contain one to five of said heteroaryl groups each of which may be fused or linked;

each $Ar^2$ is independently selected from aryl groups containing more than 6 atoms excluding H; and wherein the fullerene ball represents a fullerene selected from the group consisting of C60, C70, C84, and other fullerenes.

In one embodiment, the fullerene is substituted by one or more functional groups selected from the group consisting of:

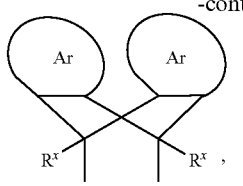

wherein each n=1-6;

each Ar is independently selected from the group consisting of monocyclic, bicyclic, and polycyclic arylene, and monocyclic, bicyclic, and polycyclic heteroarylene, or may contain one to five such groups, either fused or linked;

each $R^x$ is independently selected from the group consisting of Ar, straight-chain, branched, and cyclic alkyl with 2-40 C atoms, wherein one or more non-adjacent C atoms are optionally replaced by —O—, —S—, —C(O)—, —C(O—)—O—, —O—C(O)—, —O—C(O)—O—, —$CR^o$=$CR^{oo}$—, or —C≡C—, and wherein one or more H atoms are optionally replaced by F, Cl, Br, I, or CN or denote aryl, heteroaryl, aryloxy, heteroaryloxy, arylcarbonyl, heteroarylcarbonyl, arylcarbonyloxy, heteroarylcarbonyloxy, aryloxycarbonyl, or heteroaryloxycarbonyl having 4 to 30 ring atoms unsubstituted or substituted by one or more non-aromatic groups, wherein $R^o$ and $R^{oo}$ are independently a straight-chain, branched, or cyclic alkyl group;

each $R^1$ is independently selected from the group consisting of straight-chain, branched, and cyclic alkyl with 2-40 C atoms, wherein one or more non-adjacent C atoms are optionally replaced by —O—, —S—, —C(O)—, —C(O—)—O—, —O—C(O)—, —O—C(O)—O—, —$CR^o$=$CR^{oo}$—, or —C≡C—, and wherein one or more H atoms are optionally replaced by F, Cl, Br, I, or CN or denote aryl, heteroaryl, aryloxy, heteroaryloxy, arylcarbonyl, heteroarylcarbonyl, arylcarbonyloxy, heteroarylcarbonyloxy, aryloxycarbonyl, or heteroaryloxycarbonyl having 4 to 30 ring atoms unsubstituted or substituted by one or more non-aromatic groups, wherein the number of carbon that $R^1$ contains is larger than 1, wherein $R^o$ and $R^{oo}$ are independently a straight-chain, branched, or cyclic alkyl group;

each R is independently selected from the group consisting of straight-chain, branched, and cyclic alkyl with 2-40 C atoms, wherein one or more non-adjacent C atoms are optionally replaced by —O—, —S—, —C(O)—, —C(O—)—O—, —O—C(O)—, —O—C(O)—O—, —$CR^o$=$CR^{oo}$—, or —C≡C—, and wherein one or more H atoms are optionally replaced by F, Cl, Br, I, or CN or denote aryl, heteroaryl, aryloxy, heteroaryloxy, arylcarbonyl, heteroarylcarbonyl, arylcarbonyloxy, heteroarylcarbonyloxy, aryloxycarbonyl, or heteroaryloxycarbonyl having 4 to 30 ring atoms unsubstituted or substituted by one or more non-aromatic groups, wherein $R^o$ and $R^{oo}$ are independently a straight-chain, branched, or cyclic alkyl group;

each $Ar^1$ is independently selected from the group consisting of monocyclic, bicyclic and polycyclic heteroaryl groups, wherein each $Ar^1$ may contain one to five of said heteroaryl groups each of which may be fused or linked;

each $Ar^2$ is independently selected from aryl groups containing more than 6 atoms excluding H; and wherein the fullerene ball represents a fullerene selected from the group consisting of C60, C70, C84, and other fullerenes.

In some embodiments, the formulation is further characterized in that the fullerene is selected from the group consisting of:

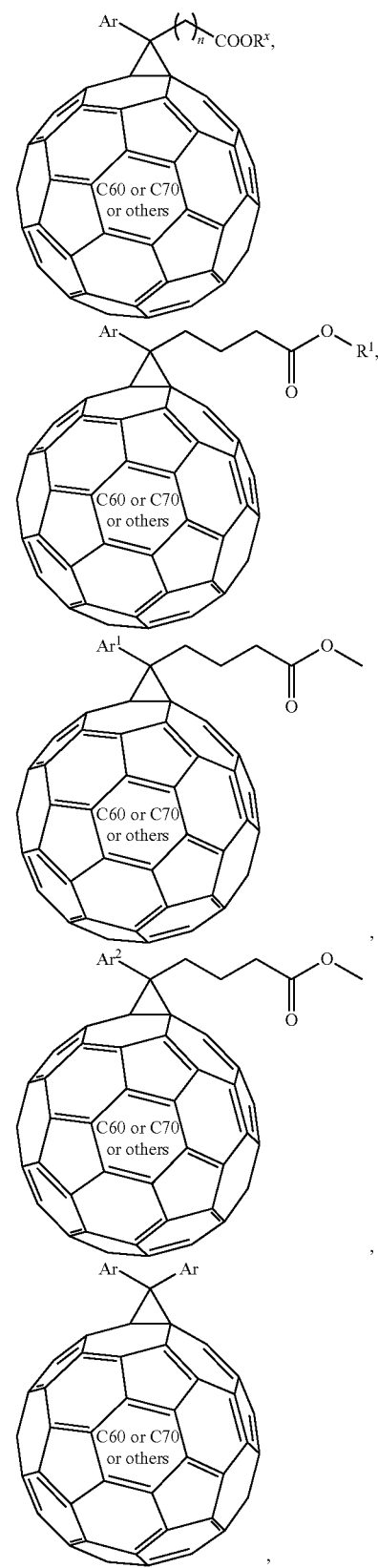

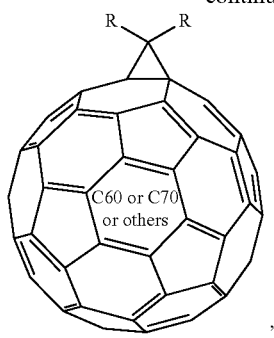

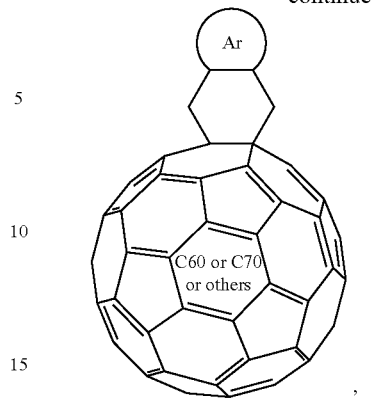

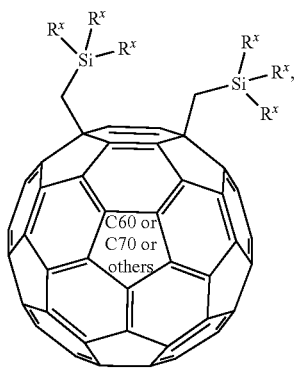

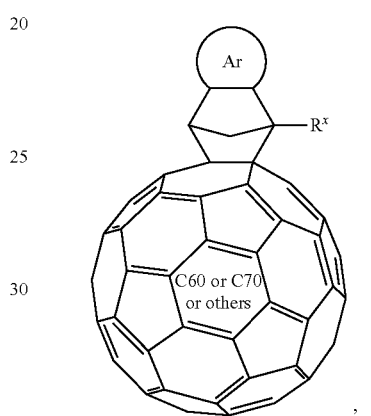

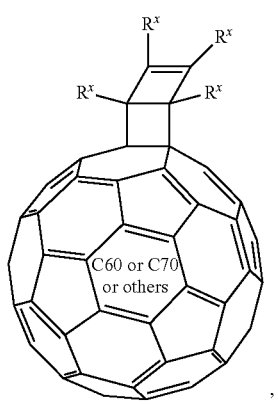

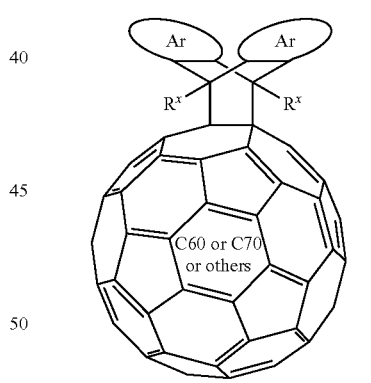

, and

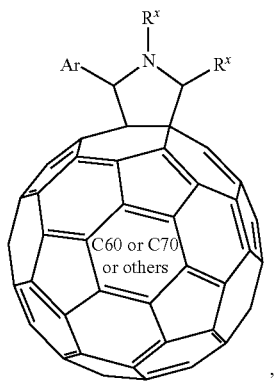

, wherein each R is independently selected from the group consisting of straight-chain, branched, and cyclic alkyl with 2-40 C atoms, wherein one or more non-adjacent C atoms are optionally replaced by —O—, —S—, —C(O)—, —C(O)—O—, —O—C(O)—, —O—C(O)—O—, —CR$^o$=CR$^{oo}$—, or —C≡C—, and wherein one or more H atoms are optionally replaced by F, Cl, Br, I, or CN or denote aryl, heteroaryl, aryloxy, heteroaryloxy, arylcarbonyl, heteroarylcarbonyl, arylcarbonyloxy, heteroarylcarbonyloxy, aryloxycarbonyl, or heteroaryloxycarbonyl having 4 to 30 ring atoms unsubstituted or substituted by one or more non-aromatic groups, wherein R$^o$ and R$^{oo}$ are independently a straight-chain, branched, or cyclic alkyl group.

In some embodiments, the formulation is further characterized in that the fullerene is selected from the group consisting of:
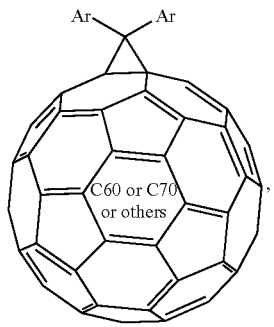
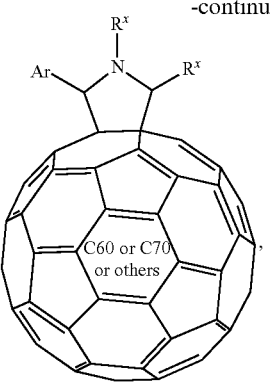
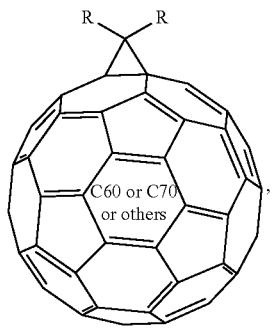
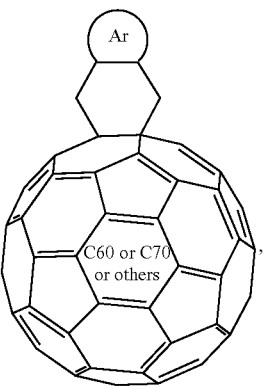
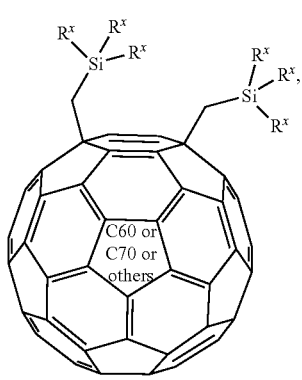
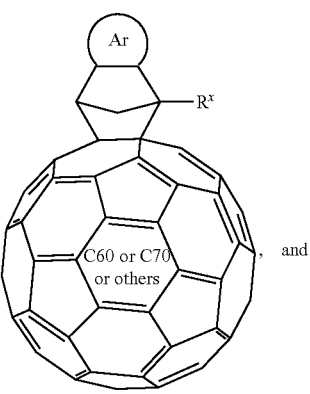, and
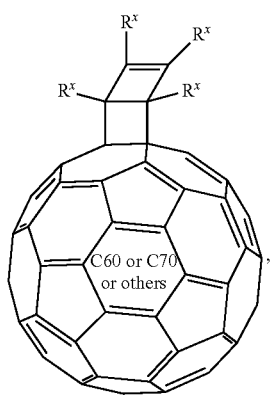
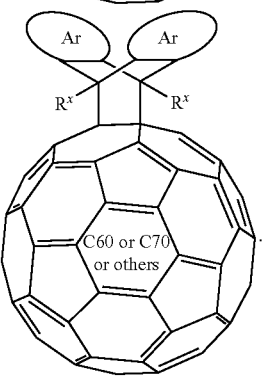.

In some embodiments, the formulation is further characterized in that the fullerene is selected from the group consisting of:

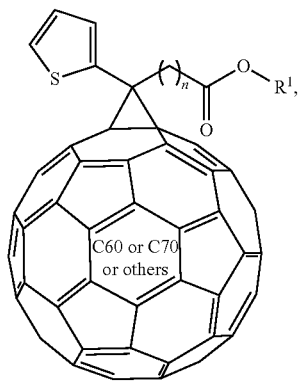

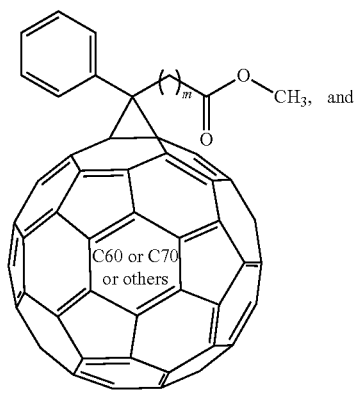

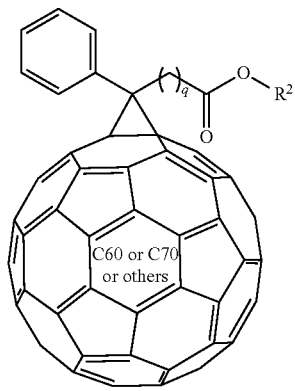

wherein each n=1–6;
each in =1, 2, 4, 5, or 6;
each q=1–6;
each $R^1$ and $R^2$ is independently selected from the group consisting of C1-4 straight and branched chain alkyl groups; and
wherein the fullerene ball represents a fullerene from the group consisting of C60, C70, C84, and other fullerenes.

In some embodiments, the formulation is further characterized in that the fullerene is selected from the group consisting of:

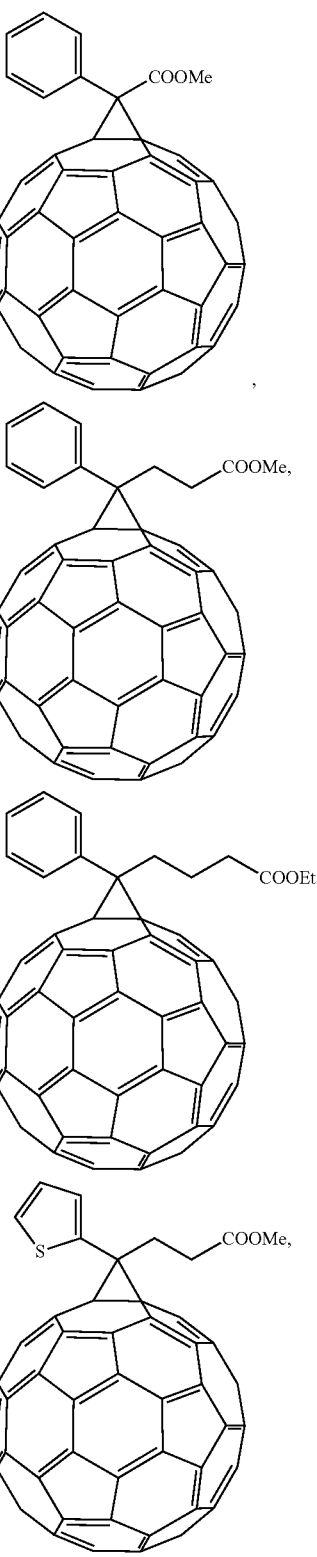

27
-continued
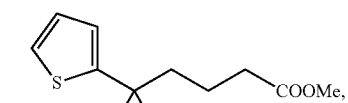
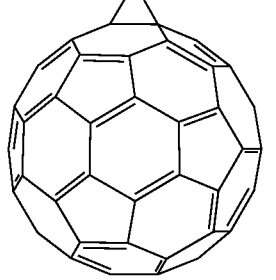
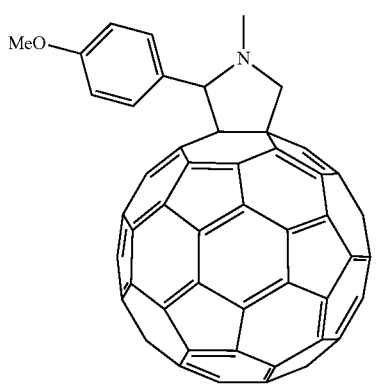,
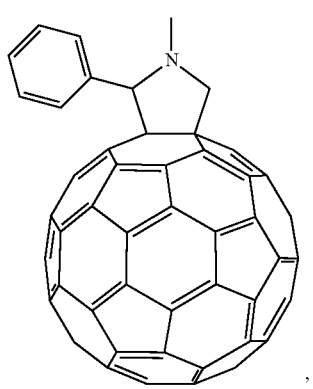,
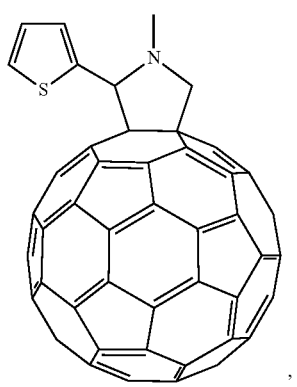,
28
-continued
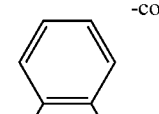
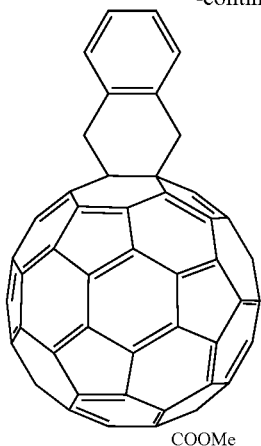,
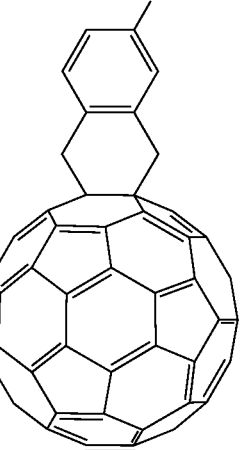,
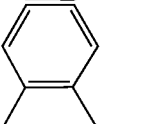
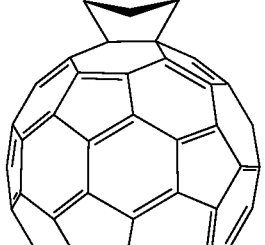,
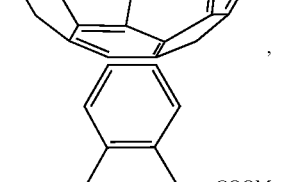
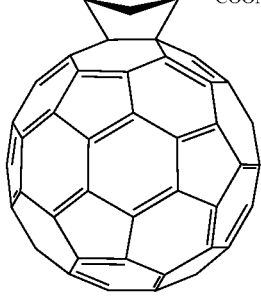,

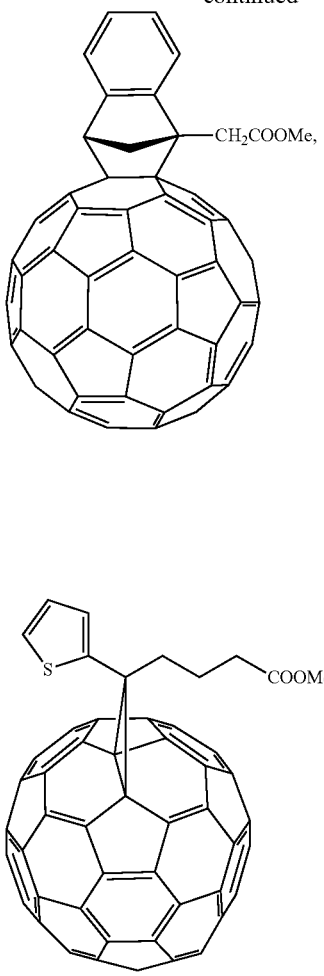

In an exemplary embodiment, an organic electronic (OE) device comprises a coating or printing ink containing the formulation. Another exemplary embodiment is further characterized in that the OE device is an organic field effect transistor (OFET) device. Another exemplary embodiment is further characterized in that the OE device is an organic photovoltaic (OPV) device.

EXAMPLES

Example 1

Synthesis of Monomers-a

Step 1: Preparation of 5,6-Difluoro-4,7-bis(4-(2-octyldodecyl)-2-thienyl)-2,1,3-benzothiadiazole (S3)

A solution of 3-(2-octyldodecyl)thiophene (5.00 g, 13.7 mmol) in 50 mL THF was cooled to −78° C. under $N_2$. Lithium diisopropylamide (2 M, 8.3 mL, 16.6 mmol) was added drop-wise and the mixture was stirred at −78° C. for 1 hour and then returned to 0° C. and stirred for an additional 1 hour. Then the mixture was cooled to −78° C. and tri-n-butyltin chloride (6.50 g, 20 mmol) was added in one portion. The reaction mixture was return to room temperature and stirred overnight. A solution of KF in water was added and the organic phase was washed with water for three times, and then dried with $Na_2SO_4$. The solvent was evaporated to get the crude product as yellow oil, which is directly used without further purification. A mixture of 2-(tri-n-butylstannyl)-4-(2-octyldodecyl)thiophene (1.96 g, 3 mmol), 4,7-dibromo-5,6-difluoro-2,1,3-benzothiadiazole (330 mg, 1 mmol), $Pd_2(dba)_3$ (11 mg, 0.02 mmol) and $P(o\text{-tol})_3$ (24 mg, 0.08 mmol) in 10 mL THF was refluxed overnight under $N_2$. The reaction mixture was then cooled to room temperature and the solvent was evaporated. The residue was purified by flash column chromatography (eluent: n-hexane) to get the product as yellow solid (650 mg, 73%). $^1$H NMR (400 MHz, $CDCl_3$) δ 8.11 (s, 2H), 7.19 (s, 2H), 2.66 (d, J=6.7 Hz, 4H), 1.77-1.62 (m, 2H), 1.42-1.14 (m, 64H), 0.97-0.84 (m, 12H). $^{13}$C NMR (100 MHz, $CDCl_3$) δ 151.15, 150.95, 148.94, 148.57, 148.36, 142.36, 132.81, 130.99, 124.83, 111.76, 111.72, 111.67, 111.63, 38.97, 34.88, 33.34, 31.93, 30.05, 29.71, 29.67, 29.38, 26.66, 22.70, 14.12. HRMS (MALDI+) Calcd for $C_{54}H_{86}F_2N_2S_3$: 896.5921. Found: 896.5943.

Step 2: Preparation of 5,6-Difluoro-4,7-bis(5-bromo-4-(2-octyldodecyl)-2-thienyl)-2,1,3-benzothiadiazole (S4)

N-Bromosuccinimide (540 mg, 3.00 mmol) was added to a mixture of S3 (1.22 g, 1.36 mmol) and silica gel (20 mg) in 20 mL chloroform at 0° C. The reaction mixture was warmed to room temperature and stirred overnight. After being washed with water, the organic phase was dried with $Na_2SO_4$ and the solvent was evaporated. The residue was purified with flash column chromatography (eluent: n-hexane) to get the product as orange solid (1.42 g, 99%). $^1$H NMR (400 MHz, $CDCl_3$) δ 7.94 (s, 2H), 2.60 (d, J=7.1 Hz, 4H), 1.80-1.70 (m, 2H), 1.40-1.15 (m, 64H), 0.90-0.77 (m, 12H). $^{13}$C NMR (100 MHz, $CDCl_3$) δ 150.95, 150.75, 148.36, 148.27, 148.16, 141.71, 132.27, 131.01, 115.14, 110.91, 110.82, 38.53, 34.09, 33.36, 31.95, 30.05, 29.74, 29.69, 29.68, 29.40, 26.56, 22.71, 14.13. HRMS (MALDI+) Calcd for $C_{54}H_{84}Br_2F_2N_2S_3$: 1052.4131. Found: 1052.4141.

Example 2

Polymer-Synthesis dried in vacuo to get the polymer as dark green solid (89 mg, 88%). $^1$H NMR (400 MHz, Toluene-d8, 359 K). δ 8.31 (br, 2H), 7.19 (br, 2H), 7.11 (br, 2H), 3.03 (br, 4H), 2.09 (br, 2H), 1.70-1.25 (m, 64H), 0.94 (br, 12H). Elem. Anal. Calcd for $C_{62}H_{88}F_2N_2S_5$: C, 70.27; H, 8.37; F, 3.59; N, 2.64; S, 15.13. Found: C, 70.33; H, 8.16; F, 3.70; N, 2.72; S, 14.91. GPC Number-averaged molecular weight ($M_n$): 39-47 kDa; weight-averaged molecular weight ($M_w$): 72-94 kDa.

Example 3

Synthesis of Monomers-b

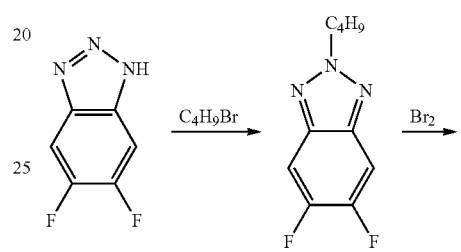

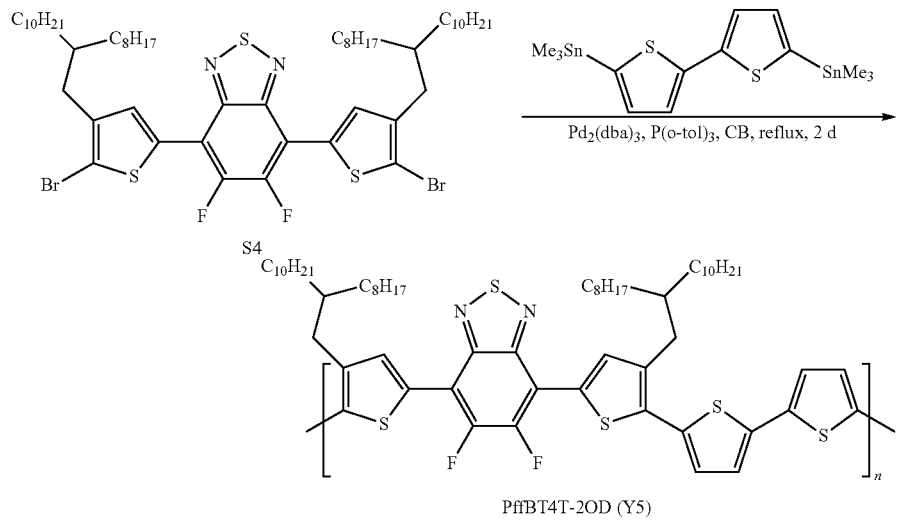

The PffBT4T-2OD polymer may be synthesized by either microwave reaction or conventional reaction. To a mixture of monomer S4 (100 mg, 0.095 mmol), 5,5'-bis(trimethylstannyl)-2,2'-bithiophene (46.7 mg, 0.095 mmol), $Pd_2(dba)_3$ (1.1 mg, 0.002 mmol) and P(o-tol)$_3$ (2.4 mg, 0.008 mmol) was added 1.6 mL of chlorobenzene in a glove box protected with $N_2$. The reaction mixture was then sealed and heated at 145° C. for 2 days (or at 160° C. for 30 min for microwave reaction). The mixture was cooled to room temperature and 10 mL toluene was added before precipitated with methanol. The solid was collected by filtration, and purified by Soxhlet extraction ($CH_2Cl_2$, $CHCl_3$, and chlorobenzene) and repetitive precipitation. The solvent was evaporated and the residue was dissolved in chlorobenzene and precipitated with methanol. The solid was collected by filtration and -continued

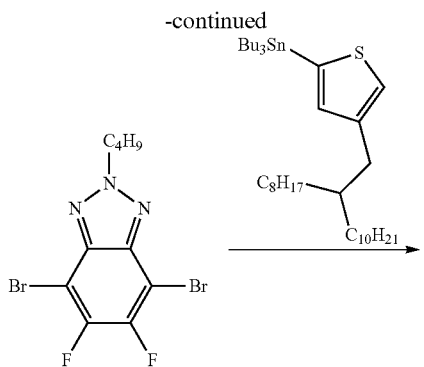

-continued

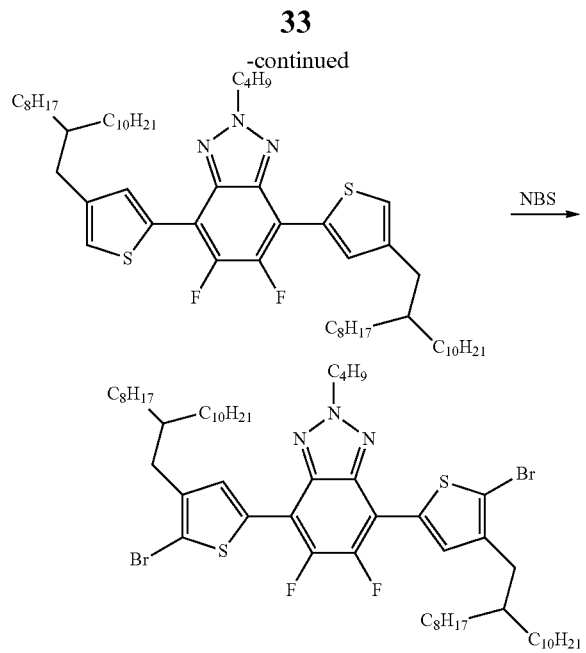

Step 1: Preparation of 2-butyl-5,6-Difluoro-1,2,3-benzotriazole

A solution of 5,6-difluoro-1,2,3-benzotriazole in 50 mL THF was added KOH and stir at room temperature for 15 min. Then n-butyl bromide was added. The mixture was allowed to stir at reflux temperature for 12 hours. After returning to room temperature, the solution was washed with water and extracted with dichloromethane. The organic layer was separated and dried over anhydrous sodium sulphate. The solvent was removed and the crude product was purified by column chromatography (eluent: n-hexane/dichloromethane=10/1) to get white solid.

Step 2: Preparation of 4,7-dibromo-2-butyl-5,6-Difluoro-1,2,3-benzotriazole 2-butyl-5,6-Difluoro-1,2,3-benzotriazole was dissolved in 50 mL trifluoroacetic acid and was cooled to 0° C. Bromide was added dropwise. The mixture was stirred room temperature for 12 hours. Then the solution was extracted with dichloromethane and washed with water for three times. The organic layer was separated and dried over anhydrous sodium sulphate. The solvent was removed and the crude product was purified by column chromatography (eluent: n-hexane/dichloromethane=12/1) to get white solid.

Step 3: Preparation of 2-butyl-5,6-difluoro-4,7-bis (4-(2-octyldodecyl)thiophen-2-yl)-1,2,3-benzotriazole A mixture of 2-(tri-n-butylstannyl)-4-(2-octyldodecyl) thiophene (1.96 g, 3 mmol), 4,7-dibromo-2-butyl-5,6-Difluoro-1,2,3-benzotriazole (330 mg, 1 mmol) and Pd (PPh$_3$)$_4$ in 10 mL toluene was refluxed overnight under N$_2$. The reaction mixture was then cooled to room temperature and the solvent was evaporated. The residue was purified by column chromatography (eluent: n-hexane/dichloromethane=5/1) to get the product as red solid (650 mg, 73%).

Step 4: Preparation of 2-butyl-5,6-difluoro-4,7-bis (5-bromo-4-(2-octyldodecyl)thiophen-2-yl)-1,2,3-benzotriazole 2-butyl-5,6-difluoro-4,7-bis(4-(2-octyldodecyl)thiophen-2-yl)-1,2,3-benzotriazole was dissolved in 10 mL chloroform and cooled to 0° C. NBS was added in portions. The solution was stirred at room temperature for 3 hours. Then the solution was extracted with chloroform and washed with water for three times. The organic layer was separated and dried over anhydrous sodium sulphate. The solvent was removed and the crude product was purified by column chromatography (eluent: n-hexane/dichloromethane=6/1) to get red solid.

Example 4

Synthesis of Monomers-c

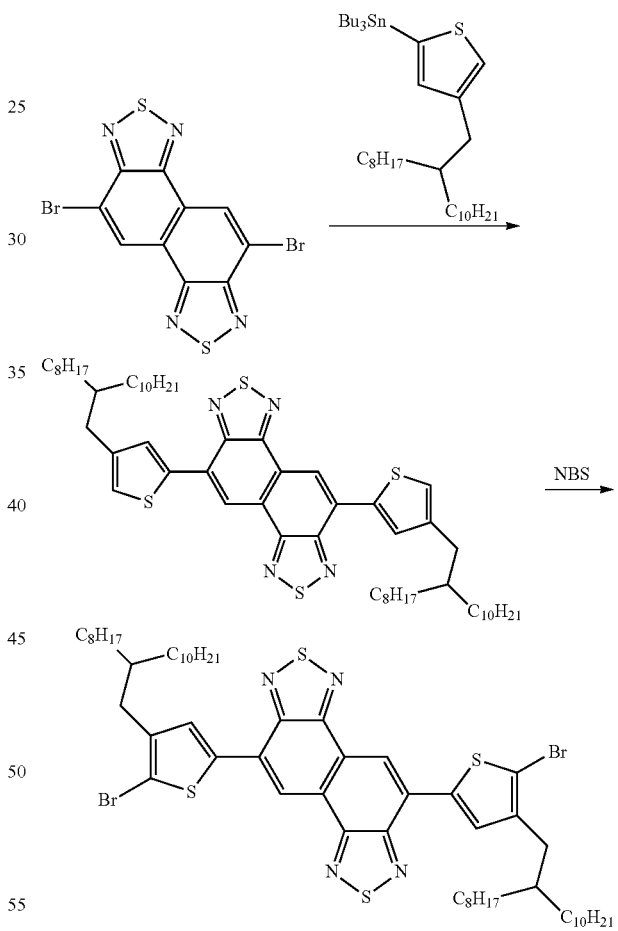

Step 1: Preparation of 5,10-bis(4-(2-octyldodecyl) thiophen-2-yl)-naphtho[1,2-c:5,6-c']bis([1,2,5]thiadiazole)

A mixture of 2-(tri-n-butylstannyl)-4-(2-octyldodecyl) thiophene (1.96 g, 3 mmol), 5,10-dibromonaphtho[1,2-c:5, 6-c']bis([1,2,5]thiadiazole) (330 mg, 1 mmol) and Pd (PPh$_3$)$_4$ in 10 mL toluene was refluxed overnight under N$_2$. The reaction mixture was then cooled to room temperature and the solvent was evaporated. The residue was purified by column chromatography (eluent: n-hexane/dichloromethane=5/1) to get the product as red solid (650 mg, 73%).

Step 2: Preparation of 5,10-bis(5-bromo4-(2-octyldodecyl)thiophen-2-yl)-naphtho[1,2-c:5,6-c']bis([1,2,5]thiadiazole)

5,10-bis(4-(2-octyldodecyl)thiophen-2-yl)-naphtho[1,2-c:5,6-c']bis([1,2,5]thiadiazole) was dissolved in 10 mL chloroform and cooled to 0° C. NBS was added in portions. The solution was stirred at room temperature for 3 hours. Then the solution was extracted with chloroform and washed with water for three times. The organic layer was separated and dried over anhydrous sodium sulphate. The solvent was removed and the crude product was purified by column chromatography (eluent: n-hexane/dichloromethane=6/1) to get red solid.

Example 4A

Synthesis of Polymer Based on Monomer-c

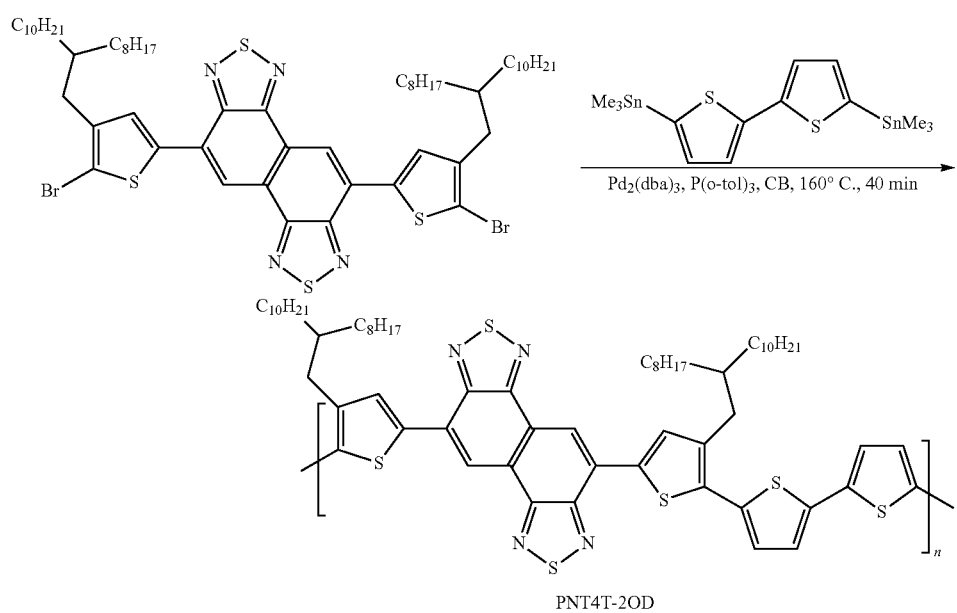

PNT4T-2OD

In a glove box protected with $N_2$, 0.2 mL of chlorobenzene was added to a mixture of monomer 5,10-bis(5-bromo4-(2-octyldodecyl)thiophen-2-yl)-naphtho[1,2-c:5,6-c']bis([1,2,5]thiadiazole) (27.4 mg, 0.024 mmol), 5,5'-bis(trimethylstannyl)-2,2'-bithiophene (12.0 mg, 0.024 mmol), $Pd_2(dba)_3$ (0.5 mg, 0.0005 mmol) and $P(o\text{-tol})_3$ (1.2 mg, 0.004 mmol) in a microwave vial equipped with a stirring bar. The reaction mixture was then sealed and heated to 160° C. for 40 minutes using a microwave reactor. The mixture was cooled to room temperature and 5 mL of chlorobenzene was added before precipitated with methanol. The solid was collected by filtration, and loaded into an extraction thimble and washed with $CHCl_3$. The polymer was finally collected from chlorobenzene. The chlorobenzene solution was then concentrated by evaporation, precipitated into methanol. The solid was collected by filtration and dried in vacuo to get the polymer as dark green solid (15.8 mg, 56%). $^1H$ NMR (400 MHz, $C_2D_2Cl_4$, 408 K). δ 9.20-8.52 (m, 2H), 8.28-8.05 (m, 2H), 7.35-7.10 (m, 2H), 2.97 (br, 4H), 2.00 (br, 2H), 1.70-1.15 (m, 64H), 1.00-0.85 (m, 12H). Elem. Anal. Calcd for $C_{66}H_{90}N_4S_6$: C, 70.04; H, 8.02; N, 4.95. Found: C, 70.22; H, 8.03; N, 4.96. GPC $M_n$=30.2 kDa; $M_w$=49.9 kDa; PDI=1.65.

Example 5

Synthesis of Monomers-d

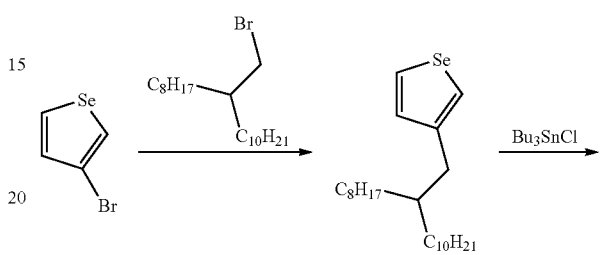

-continued

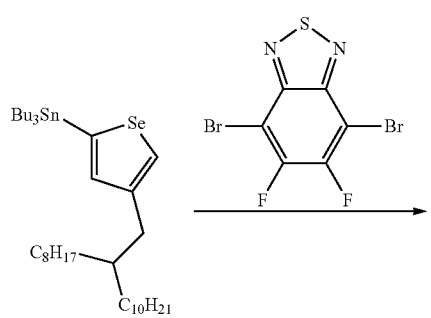

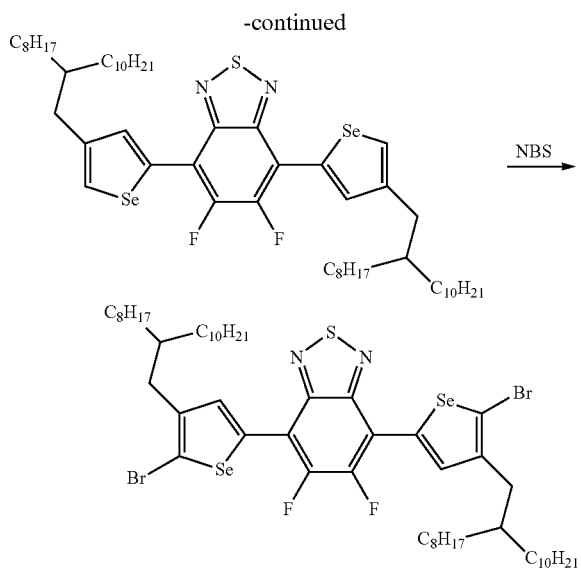

Step 1: Preparation of 3-(2-octyldodecyl)selenophene

A 3-bromoselenophene and Ni(dppp)Cl$_2$ was dissolved in diethyl ether under nitrogen and cooled to 0° C. 9-(bromomethyl)nonadecane was added drop-wise. The mixture was stirred at room temperature for 24 hours. Then the reaction mixture was washed with water and extracted with diethyl ether. The organic layer was separated and dried over anhydrous sodium sulphate. The solvent was removed and the crude product was purified by column chromatography (eluent: n-hexane) to get product as colorless oil.

Step 2: 2-(tri-n-butylstannyl)-4-(2-octyldodecyl) selenophene

A solution of 3-(2-octyldodecyl)selenophene (5.00 g, 13.7 mmol) in 50 mL THF was cooled to −78° C. under N$_2$. Lithium diisopropylamide (2 M, 8.3 mL, 16.6 mmol) was added drop-wise and the mixture was stirred at −78° C. for 1 hour and then returned to 0° C. and stirred for additional 1 hour. Then the mixture was cooled to −78° C. and tri-n-butyltin chloride (6.50 g, 20 mmol) was added in one portion. The reaction mixture was returned to room temperature and stirred overnight. A solution of KF in water was added and the organic phase was washed with water for three times, then dried with Na$_2$SO$_4$. The solvent was evaporated to get the crude product as yellow oil, which is directly used without further purification.

Step 3: Preparation of 5,6-difluoro-4,7-bis(4-(2-octyldodecyl)selenophen-2-yl)-2,1,3-benzothiadiazole A mixture of 2-(tri-n-butylstannyl)-4-(2-octyldodecyl) selenophene (1.96 g, 3 mmol), 4,7-dibromo-2,1,3-benzothiadiazole (330 mg, 1 mmol) and Pd (PPh$_3$)$_4$ in 10 mL toluene was refluxed overnight under N$_2$. The reaction mixture was then cooled to room temperature and the solvent was evaporated. The residue was purified by column chromatography (eluent: n-hexane/dichloromethane=5/1) to get the product as red solid (650 mg, 73%).

Step 4: Preparation of 5,6-difluoro-4,7-bis(5-bromo-4-(2-octyldodecyl)selenophen-2-yl)-2,1,3-benzothiadiazole 5,6-difluoro-4,7-bis(4-(2-octyldodecyl) selenophen-2-yl)-2,1,3-benzothiadiazole was dissolved in 10 mL chloroform and cooled to 0° C. NBS was added in portions. The solution was stirred at room temperature for 3 h. Then the solution was extracted with chloroform and washed with water for three times. The organic layer was separated and dried over anhydrous sodium sulphate. The solvent was removed and the crude product was purified by column chromatography (eluent: n-hexane/dichloromethane=6/1) to get red solid.

Example 6

Synthesis of Monomers-NBT

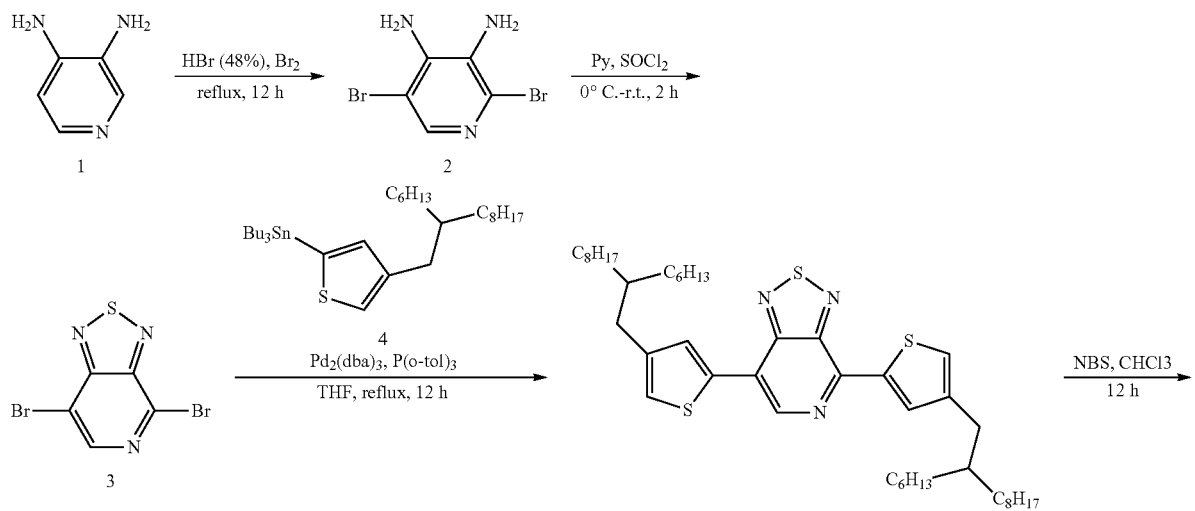

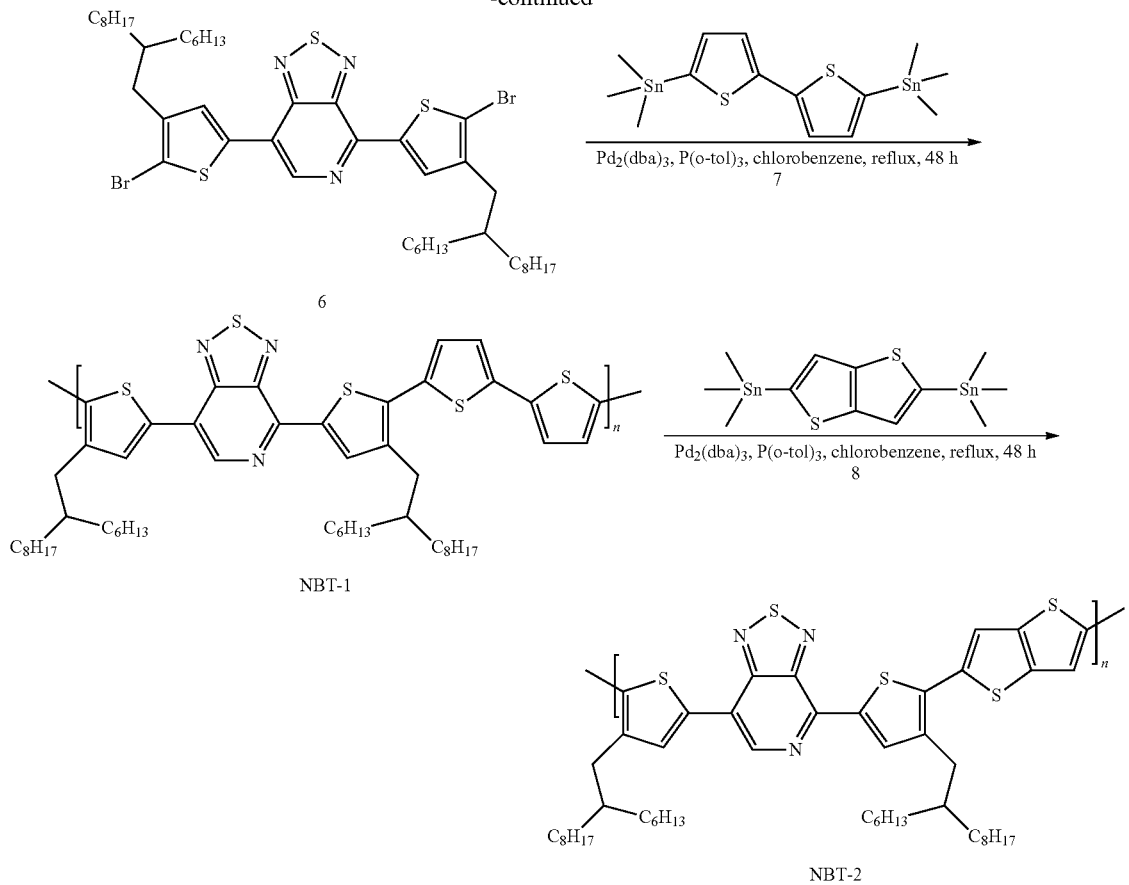

Step. 1 Preparation of 2,5-dibromopyridine-3,4-diamine (2)

To a solution of 5 mL 48% HBr and pyridine-3,4-diamine (393 mg, 3.6 mmol) bromine (0.6 mL, 11.7 mmol) was added drop-wise. The reaction mixture was then allowed to reflux overnight, then quenched and basified with $Na_2SO_3$ and $NA_2CO_3$, and filtered to get product as white solid. (410 mg, 42.6%).

Step. 2 Preparation of 4,7-dibromo-[1,2,5]thiadiazolo[3,4-c]pyridine (3)

(2) (836.9 mg, 3.1 mmol) was dissolved into 10 mL of dry pyridine. Thionyl chloride (0.45 mL, 6.3 mmol) was added onto the solution drop-wise under $N_2$ protection at 0° C., the reaction mixture was then stirred at 0° C. for 2 h followed with pouring into ice-cooled water. Then the mixture was filtered to get the product as red solid. (642 mg, 69%).

Step. 3: Preparation of 4,7-bis(4-(2-hexyldecyl) thiophen-2-yl)-[1,2,5]thiadiazolo[3,4-c]pyridine (4)

(3) (100 mg, 0.34 mmol), (4) (486 mg, 0.81 mmol), $Pd_2(dba)_3$ (11 mg, 0.02 mmol) and $P(o\text{-}Tol)_3$ (24 mg, 0.08 mmol) were dissolved into 2 mL dry THF under $N_2$ protection. The reaction mixture was then allowed to reflux overnight. After reaction, the solvent was removed and the residue was purified with column chromatography using hexane as eluent to get the product as reddish oil. (195 mg, 76%).

Step. 4: Preparation of 4,7-bis(5-bromo-4-(2-hexyldecyl)thiophen-2-yl)-[1,2,5]thiadiazolo[3,4-c]pyridine (5)

(4) (195 mg, 0.26 mmol) and NBS (102 mg, 5.7 mmol) was dissolved into 7 mL chloroform. The reaction mixture was then allowed to stir overnight. Then the solvent was removed and the residue was purified with column chromatography using hexane as eluent to get the product as dark red solid. (205 mg, 88 mg).

Example 7

Polymer-NBT Synthesis

Monomer (5) (90.8 mg, 0.1 mmol), (7) or (8) (0.1 mmol), $Pd_2(dba)_3$ (1.1 mg, 0.002 mmol) and $P(o\text{-}Tol)_3$ (2.4 mg, 0.008 mmol) was dissolved into 0.3 mL chlorobenzene followed by refluxed overnight. The reaction mixture was then dissolved into 10 mL chlorobenzene and precipitated from MeOH. The precipitate was collected by filtration, the dark green solid was placed in to a Soxhlet Extractor and was extracted with methanol, acetone, dichloromethane, and chloroform. Finally the chloroform portion was dissolved into toluene and precipitated from MeOH. The solid was collected in order to get the product as dark green solid. (60-68%).

Example 8
Synthesis of Fullerenes
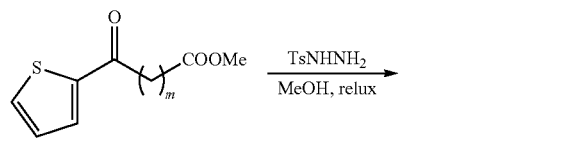
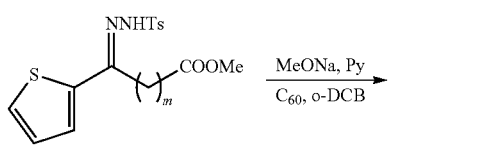
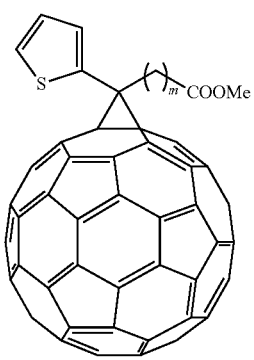
TC$_{61}$PM: m = 2;
TC$_{61}$BM: m = 3.
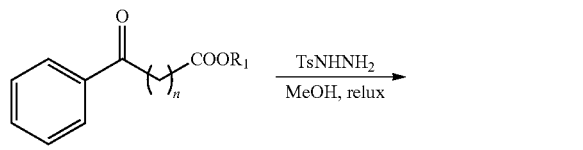
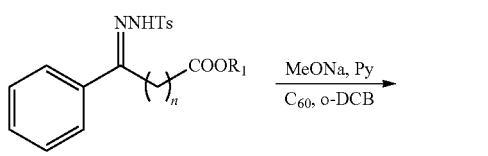
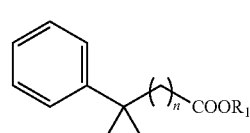
PC$_{61}$MM: n = 0, R$_1$ = Me;
PC$_{61}$PM: n = 2, R$_1$ = Me;
PC$_{61}$BE: n = 3, R$_1$ = Et.
-continued
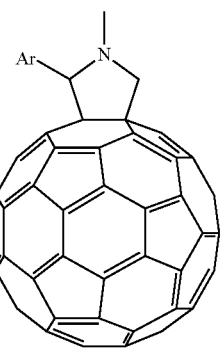
MOPFP: Ar = 4-methoxyphenyl;
PFP: Ar = phenyl;
TFP: Ar = 2-thienyl.
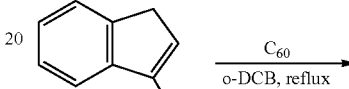
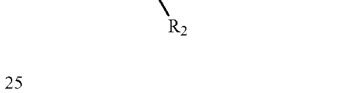
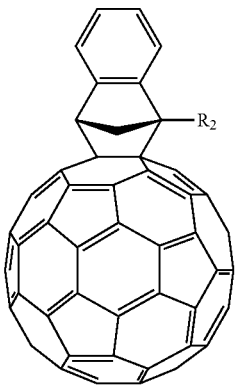
ICMA: R$_2$ = H;
ICMM: R$_2$ = COOMe;
ICEM: R$_2$ = CH$_2$COOMe.
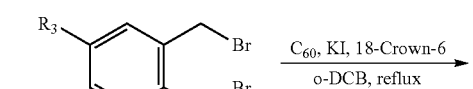
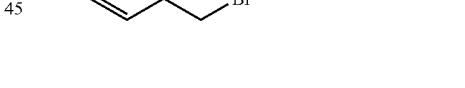
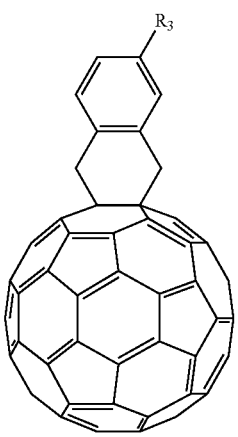
NCMA: R$_3$ = H;
NCMM: R$_3$ = COOMe.

Example 8a

Preparation of the Hydrazones

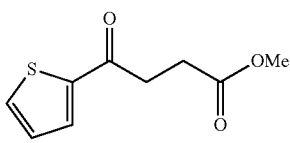

S5

Step 1: Preparation of Methyl 4-oxo-4-(2-thienyl)butanoate (S5)

A solution of 4-oxo-4-(2-thienyl)butyric acid (1.84 g, 10 mmol) in MeOH (20 ml) with a catalytic amount of hydrochloric acid was refluxed overnight. The mixture was cooled to room temperature, diluted with $H_2O$ and extracted with $CH_2Cl_2$. The organic phase was washed with $H_2O$, brine, dried with $Na_2SO_4$, filtered and concentrated in vacuo. The residue was purified by flash column chromatography (eluent: n-hexane/ethyl acetate=5/1). The product was obtained as transparent oil (1.81 g, 91%). $^1$H NMR (400 MHz, $CDCl_3$) δ 7.77 (d, J=3.8 Hz, 1H), 7.65 (d, J=4.9 Hz, 1H), 7.19-7.08 (m, 1H), 3.70 (s, 3H), 3.27 (t, J=6.7 Hz, 2H), 2.77 (t, J=6.7 Hz, 2H). $^{13}$C NMR (100 MHz, $CDCl_3$) δ 190.98, 173.17, 143.62, 133.68, 132.00, 128.13, 51.89, 33.94, 27.99.

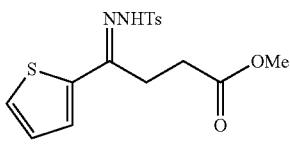

S6

Step 2: Preparation of Methyl 4-oxo-4-(2-thienyl)butanoate-p-tosylhydrazone (S6)

A mixture of S5 (595 mg, 3 mmol), p-toluene-sulfonyl hydrazide (559 mg, 3 mmol), and MeOH (3 ml) was refluxed overnight. The mixture was cooled to −20° C. The precipitate was collected by filtration and washed with MeOH. The product was obtained as white solid without further purification (800 mg, 73%). $^1$H NMR (400 MHz, $CDCl_3$) δ 9.71 (s, 1H), 7.93 (d, J=8.2 Hz, 2H), 7.33-7.27 (m, 3H), 7.09 (d, J=3.7 Hz, 1H), 6.99-6.94 (m, 1H), 3.59 (s, 3H), 2.93-2.82 (m, 2H), 2.75-2.65 (m, 2H), 2.40 (s, 3H). $^{13}$C NMR (100 MHz, $CDCl_3$) δ 174.09, 149.95, 143.06, ° 0.88, 134.83, 128.56, 127.82, 127.64, 126.51, 125.39, 51.90, 30.75, 21.51, 20.97. HRMS (MALDI+) Calculated for $C_{16}H_{19}N_2O_4S_2$ (M+H$^+$): 367.0786. Found: 367.0760.

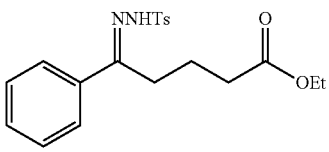

S7

Step 3: Preparation of Ethyl 5-oxo-5-phenylpentanoate-p-tosylhydrazone (S7)

A mixture of ethyl 5-oxo-5-phenylpentanoate (466 mg, 2.12 mmol), p-toluene-sulfonyl hydrazide (394 mg, 2.12 mmol), and MeOH (7 ml) was refluxed overnight. The mixture was cooled to −20° C. The precipitate was collected by filtration and washed with MeOH. The product was obtained as white solid without further purification (460 mg, 56%). $^1$H NMR (400 MHz, $CDCl_3$) δ 9.30 (s, 1H), 7.91 (d, J=8.2 Hz, 2H), 7.65 (dd, J=6.6, 3.0 Hz, 2H), 7.33 (m, 5H), 4.27 (q, J=7.1 Hz, 2H), 2.68-2.59 (m, 2H), 2.40 (s, 3H), 2.34-2.27 (m, 2H), 1.73-1.62 (m, 2H), 1.31 (t, J=7.1 Hz, 3H). $^{13}$C NMR (100 MHz, $CDCl_3$) δ 173.84, 152.95, 143.06, 135.54, 135.43, 128.84, 127.80, 127.31, 125.57, 60.79, 31.63, 25.22, 20.96, 20.34, 13.59. HRMS (MALDI+) Calculated for $C_{20}H_{25}N_2O_4S$ (M+H$^+$): 389.1535. Found: 389.1536.

Example 8b

Preparation of the Fullerene Derivatives

Step 1: General Procedure A

Hydrazone (0.208 mmol) and MeONa (12.0 mg, 0.222 mmol) were suspended in dry pyridine (4 mL) under $N_2$ and the mixture was stirred at room temperature for ~30 min. Then a solution of $C_{60}$ (100 mg, 0.139 mmol) in o-DCB (14 mL) was added. The reaction mixture was heated to 180° C. overnight before being cooled to room temperature. The solvent was evaporated under reduced pressure. The residue was purified by flash column chromatography twice (eluent: $CS_2/CH_2Cl_2$=2/1 for the first column, toluene for the second one). The obtained solid was dissolved in a minimal amount of hot $CHCl_3$ and subsequently precipitated with MeOH. The precipitate was collected by filtration and dried in vacuo at ~80° C. to give the product.

Step 2: General Procedure B

A solution of $C_{60}$ (100 mg, 0.139 mmol), sarcosine (124 mg, 1.39 mmol), and aldehyde (0.690 mmol) in toluene (100 mL) was refluxed under $N_2$ for ~8 hours. The mixture was cooled to room temperature and the solvent was evaporated under reduced pressure. The residue was purified by flash column chromatography twice (eluent: $CS_2/CH_2Cl_2$=4/1 for the first column, toluene/n-hexane=2:1 for the second one). The obtained solid was dissolved in a minimal amount of $CS_2$ and subsequently precipitated with n-hexane. The precipitate was collected by filtration and dried in vacuo at ~80° C. to give the product.

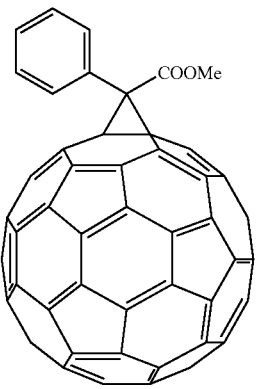

Example 8c

Preparation of [6,6]-Phenyl-C61-methanoic acid methyl ester (PC$_{61}$MM)

As brown powder from methyl 2-oxo-2-phenylacetate-p-tosylhydrazone(1) (60.8 mg, 0.183 mmol) and 10.4 mg MeONa (0.192 mmol) according to the General Procedure A (9.1 mg, 8%). $^1$H NMR (400 MHz, CDCl$_3$) δ 8.12 (dd, J=8.0, 1.5 Hz, 2H), 7.63-7.49 (m, 3H), 3.98 (s, 3H). $^{13}$C NMR (100 MHz, CDCl$_3$) δ 167.24, 147.41, 146.27, 145.51, 145.22, 145.18, 145.14, 144.73, 144.70, 144.52, 144.47, 144.37, 143.91, 143.72, 143.12, 143.04, 142.99, 142.92, 142.40, 142.19, 142.14, 142.07, 140.97, 138.29, 137.84, 132.39, 132.35, 129.40, 128.74, 75.54, 55.84, 53.86. HRMS (MALDI+) Calculated for C$_{69}$H$_8$O$_2$ (M$^+$): 868.0524. Found: 868.0542.

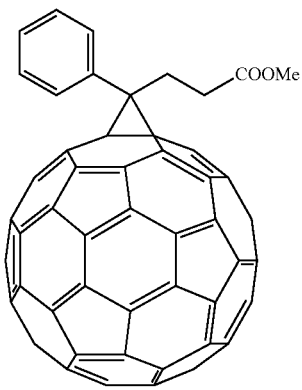

Example 8d

Preparation of [6,6]-Phenyl-C61-propanoic acid methyl ester (PC$_{61}$PM)

As dark brown powder from methyl 4-oxo-4-phenylbutanoate-p-tosylhydrazone(2) (75.0 mg, 0.208 mmol) according to the General Procedure A (42.2 mg, 34%). $^1$H NMR (400 MHz, CDCl$_3$) δ 7.93 (d, J=7.2 Hz, 2H), 7.59-7.45 (m, 3H), 3.69 (s, 3H), 3.31-3.14 (m, 2H), 2.96-2.79 (m, 2H).

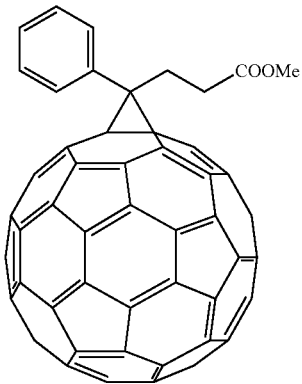

Example 8e

Preparation of [6,6]-Phenyl-C61-butyric acid ethyl ester (PC$_{61}$BE)

As brown powder from S7 (120 mg, 0.309 mmol), 18.0 mg MeONa (0.333 mmol) and 200 mg C$_{60}$ (0.238 mmol) according to the General Procedure A (97.9 mg, 44%). $^1$H NMR (400 MHz, CDCl$_3$) δ 7.93 (d, J=7.2 Hz, 2H), 7.55 (t, J=7.5 Hz, 2H), 7.47 (t, J=7.3 Hz, 1H), 4.14 (q, J=7.1 Hz, 2H), 2.97-2.85 (m, 2H), 2.51 (t, J=7.5 Hz, 2H), 2.25-2.10 (m, 2H), 1.25 (t, J=7.1 Hz, 3H). $^{13}$C NMR (100 MHz, CDCl$_3$) δ 173.09, 148.84, 147.83, 145.87, 145.20, 145.16, 145.09, 145.04, 144.80, 144.69, 144.67, 144.51, 144.43, 144.01, 143.77, 143.04, 143.00, 142.94, 142.24, 142.18, 142.14, 142.12, 140.99, 140.75, 138.05, 137.57, 136.76, 132.12, 128.44, 128.24, 79.89, 60.55, 51.89, 34.15, 33.68, 22.38, 14.27. HRMS (MALDI+) Calculated for C$_{73}$H$_{16}$O$_2$ (M$^+$): 924.1150. Found: 924.1187.

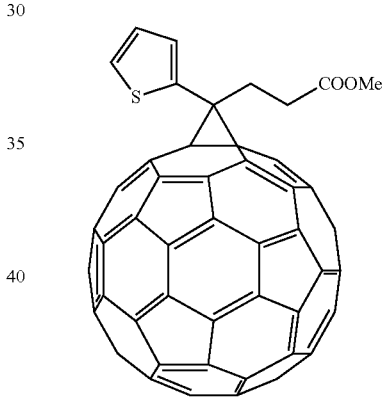

Example 8f

Preparation of [6,6]-(2-Thienyl)-C61-propanoic acid methyl ester (TC$_{61}$PM)

As brown powder from S6 (76.3 mg, 0.208 mmol) according to the General Procedure A (45.8 mg, 37%). $^1$H NMR (400 MHz, CDCl$_3$) δ 7.51-7.47 (m, 2H), 7.14 (dd, J=5.1, 3.6 Hz, 1H), 3.72 (s, 3H), 3.30-3.23 (m, 2H), 2.97-2.88 (m, 2H). $^{13}$C NMR (100 MHz, CDCl$_3$) δ 172.82, 148.11, 147.08, 145.62, 145.27, 145.24, 145.16, 145.01, 144.84, 144.69, 144.64, 144.55, 144.22, 143.81, 143.07, 143.04, 142.97, 142.21, 142.18, 142.14, 141.01, 140.78, 138.55, 138.34, 138.21, 132.31, 126.58, 126.25, 79.63, 51.97, 44.84, 31.79, 30.05. HRMS (MALDI+) Calculated for C$_{69}$H$_{10}$O$_2$S (M$^+$): 902.0402. Found: 902.0445.

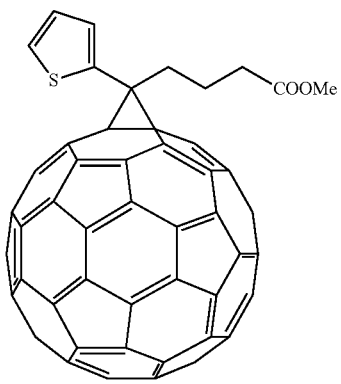

Example 8g

Preparation of [6,6]-(2-Thienyl)-C61-butyric acid methyl ester (TC$_{61}$BM)

As brown powder from methyl 5-oxo-5-(2-thienyl)pentanoate-p-tosylhydrazone (73.6 mg, 0.694 mmol) according to the General Procedure A (15.8 mg, 13%). $^1$H NMR (400 MHz, CDCl$_3$) δ 7.52-7.45 (m, 2H), 7.14 (dd, J=5.2, 3.5 Hz, 1H), 3.69 (s, 3H), 3.00-2.91 (m, 2H), 2.58 (t, J=7.5 Hz, 2H), 2.29-2.19 (m, 2H).

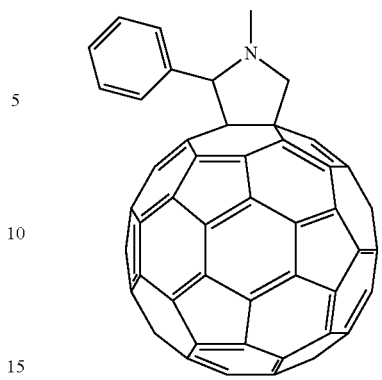

Example 8i

Preparation of N-Methyl-2-phenylfulleropyrrolidine (PFP)

As brown powder from benzaldehyde (73.6 mg, 0.694 mmol) according to the General Procedure B (15.8 mg, 13%). $^1$H NMR (400 MHz, CDCl$_3$) δ 7.80 (br, 2H), 7.43 (t, J=7.8 Hz, 2H), 7.37-7.31 (m, 1H), 5.00 (d, J=9.3 Hz, 1H), 4.94 (s, 1H), 4.27 (d, J=9.4 Hz, 1H), 2.82 (s, 3H).

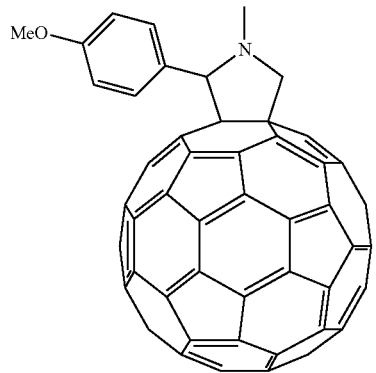

Example 8h

Preparation of N-Methyl-2-(4-methoxyphenyl) fulleropyrrolidine (MOPFP)

As brown powder from p-anisaldehyde (94.4 mg, 0.694 mmol) according to the General Procedure B (28.9 mg, 24%). $^1$H NMR (400 MHz, CDCl$_3$) δ 7.71 (br, 2H), 6.96 (d, J=8.8 Hz, 2H), 4.98 (d, J=9.4 Hz, 1H), 4.89 (s, 1H), 4.24 (d, J=9.4 Hz, 1H), 3.82 (s, 3H), 2.79 (s, 3H). $^{13}$C NMR (100 MHz, CDCl$_3$/CS$_2$) δ 159.02, 155.71, 153.39, 152.99, 152.89, 146.70, 146.17, 145.90, 145.73, 145.54, 145.35, 145.18, 145.03, 144.92, 144.84, 144.80, 144.67, 144.56, 144.08, 143.81, 142.57, 142.44, 142.11, 142.00, 141.68, 141.52, 141.46, 141.38, 141.27, 141.11, 140.99, 139.59, 139.41, 139.03, 136.23, 136.02, 135.20, 129.79, 128.18, 82.56, 69.45, 68.28, 54.33, 39.44. HRMS (MALDI+) Calculated for C$_{70}$H$_{14}$NO (M+H$^+$): 884.1075. Found: 884.1119.

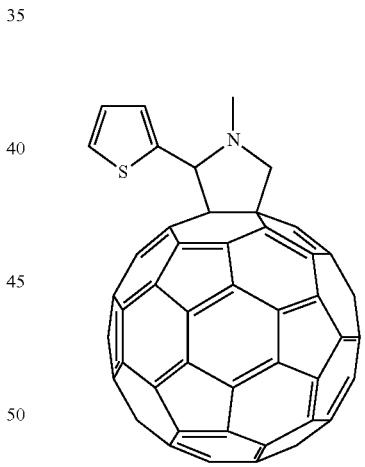

Example 8j

Preparation of N-Methyl-2-(2-Thienyl) fulleropyrrolidine (TFP)

As brown powder from 2-thiophenecarboxaldehyde (77.9 mg, 0.694 mmol) according to the General Procedure B (44.2 mg, 37%). $^1$H NMR (400 MHz, CDCl$_3$) δ 7.41-7.36 (m, 2H), 7.04 (dd, J=5.1, 3.5 Hz, 1H), 5.27 (s, 1H), 4.98 (d, J=9.4 Hz, 1H), 4.25 (d, J=9.6 Hz, 1H), 2.90 (s, 3H).

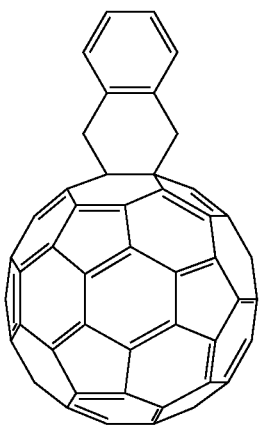

Example 8k

Preparation of NCMA

A solution of $C_{60}$ (200 mg, 0.278 mmol), KI (184 mg, 1.11 mmol), 18-crown-6 (293 mg, 1.11 mmol) and α,α'-dibromo-o-xylene (73.3 mg, 0.278 mmol) in o-DCB (110 mL) was refluxed for 48 hours in the dark under $N_2$. The mixture was cooled to room temperature and the solvent was evaporated under reduced pressure. The residue was purified by flash column chromatography twice ($CS_2$/n-hexane=1/2). The obtained solid was dissolved in a minimal amount of $CS_2$ and subsequently precipitated with n-hexane. The precipitate was collected by filtration and dried in vacuo at ~80° C. to give the product as brown powder (126.2 mg, 55%). $^1$H NMR (400 MHz, CDCl$_3$) δ 7.69 (dd, J=5.1, 3.7 Hz, 2H), 7.57 (dd, J=5.3, 3.5 Hz, 2H), 4.83 (d, J=12.8 Hz, 2H), 4.44 (d, J=13.7 Hz, 2H).

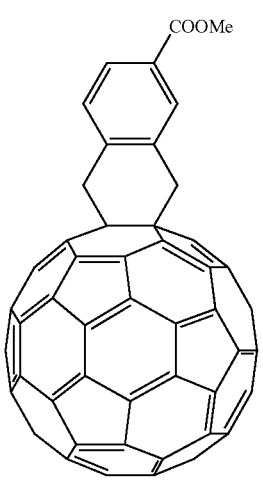

Example 8l

Preparation of NCMA-Methanoic Acid Methyl Ester (NCMM)

A solution of $C_{60}$ (100 mg, 0.139 mmol), KI (92 mg, 0.555 mmol), 18-crown-6 (147 mg, 0.555 mmol) and methyl 3,4-bis(bromomethyl)benzoate (44.7 mg, 0.139 mmol) in o-DCB (55 mL) was refluxed for 48 hours in the dark under $N_2$. The mixture was cooled to room temperature and the solvent was evaporated under reduced pressure. The residue was purified by flash column chromatography twice (eluent: $CS_2$/$CH_2Cl_2$=2/1 for the first column, toluene for the second one). The obtained solid was dissolved in a minimal amount of $CS_2$ and subsequently precipitated with n-hexane. The precipitate was collected by filtration and dried in vacuo at ~80° C. to give the product as brown powder (47.5 mg, 39%). $^1$H NMR (400 MHz, CDCl$_3$) δ 8.37 (s, 1H), 8.26 (d, J=7.7 Hz, 1H), 7.77 (d, J=7.8 Hz, 1H), 4.85 (d, J=14.4 Hz, 2H), 4.51 (d, J=13.5 Hz, 2H), 4.02 (s, 3H).

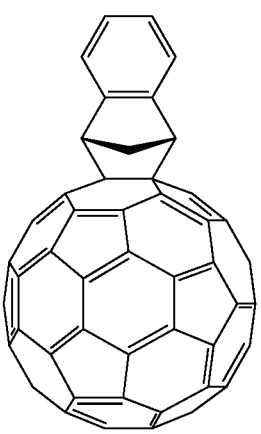

Example 8m

Preparation of ICMA

A solution of indene (291 mg, 2.50 mmol) and $C_{60}$ (721 mg, 1.00 mmol) in o-DCB (55 mL) was refluxed overnight. The reaction mixture was then cooled to room temperature and precipitated with methanol. The solid was collected by filtration and purified with flash column chromatography several times (eluent: toluene/n-hexane=10/1) to get the product as dark brown powder (193 mg, 23%). $^1$H NMR (400 MHz, CDCl$_3$) δ 7.67-7.57 (m, 2H), 7.49-7.40 (m, 2H), 4.95 (s, 2H), 3.86 (d, J=10.1 Hz, 1H), 2.93 (d, J=10.1 Hz, 1H).

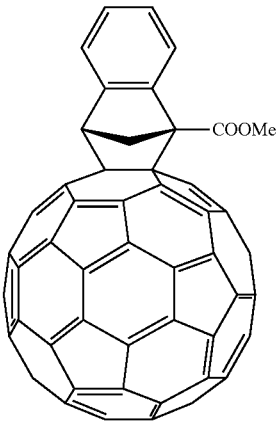

Example 8n

Preparation of ICMA-Methanoic Acid Methyl Ester (ICMM)

A solution of methyl 1H-indene-3-carboxylate (121 mg, 0.69 mmol) and $C_{60}$ (250 mg, 0.35 mmol) in o-DCB (10 mL) was refluxed overnight. The reaction mixture was then cooled to room temperature and precipitated with methanol. The solid was collected by filtration and purified with flash column chromatography twice (eluent: toluene). The obtained solid was dissolved in a minimal amount of toluene and subsequently precipitated with MeOH. The precipitate was collected by filtration and dried in vacuo at ~80° C. to give the product as black powder (83 mg, 27%). $^1$H NMR (400 MHz, CDCl$_3$) δ 7.93-7.87 (m, 1H), 7.65 (dd, J=5.6, 2.8 Hz, 1H), 7.55-7.48 (m, 2H), 4.96 (s, 1H), 4.10 (dd, J=10.5, 1.4 Hz, 1H), 3.99 (s, 3H), 3.18 (dd, J=10.5, 1.7 Hz, 1H). $^{13}$C NMR (100 MHz, CDCl$_3$) δ 170.11, 155.03, 153.69, 152.38, 152.10, 146.66, 145.75, 145.62, 145.48, 144.90, 144.77, 144.68, 144.59, 144.41, 143.87, 142.61, 142.39, 142.08, 141.92, 141.61, 141.50, 141.31, 141.21, 141.04, 139.66, 139.18, 139.07, 138.42, 137.20, 136.92, 136.65, 127.56, 127.07, 123.59, 123.25, 75.65, 68.83, 55.62, 51.98, 47.37. HRMS (MALDI+) Calculated for $C_{71}H_{10}O_2$ (M$^+$): 894.0681. Found: 894.0673.

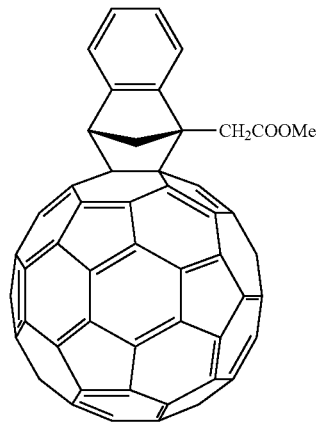

Example 8o

Preparation of ICMA-Ethanoic Acid Methyl Ester (ICEM)

A solution of methyl 1H-indene-3-acetate (70 mg, 0.372 mmol) and $C_{60}$ (120 mg, 0.167 mmol) in o-DCB (12 mL) was refluxed overnight. The reaction mixture was then cooled to room temperature and precipitated with methanol. The solid was collected by filtration and purified with flash column chromatography twice (eluent: toluene). The obtained solid was dissolved in a minimal amount of CHCl$_3$ and subsequently precipitated with MeOH. The precipitate was collected by filtration and dried in vacuo at ~80° C. to give the product as brown solid (44 mg, 29%). $^1$H NMR (400 MHz, CDCl$_3$) δ 7.57-7.51 (m, 1H), 7.51-7.45 (m, 1H), 7.41-7.34 (m, 2H), 4.89 (s, 1H), 3.98 (d, J=15.1 Hz, 1H), 3.76 (dd, J=10.3, 1.4 Hz, 1H), 3.73-3.65 (m, 4H), 3.25 (dd, J=10.3, 1.7 Hz, 1H). $^{13}$C NMR (100 MHz, CDCl$_3$) δ 170.97, 156.15, 154.50, 153.28, 152.62, 146.65, 146.58, 145.75, 145.68, 145.59, 145.51, 145.48, 145.43, 145.36, 145.06, 144.99, 144.89, 144.82, 144.79, 144.78, 144.55, 144.50, 144.33, 144.07, 143.89, 143.81, 143.66, 142.47, 142.21, 142.11, 142.05, 141.94, 141.91, 141.59, 141.50, 141.42, 141.40, 141.38, 141.29, 141.23, 141.16, 141.12, 139.61, 139.13, 138.92, 138.84, 137.29, 137.03, 136.58, 126.96, 126.68, 123.49, 121.97, 77.93, 61.58, 56.10, 51.36, 48.85, 35.72. HRMS (MALDI+) Calculated for $C_{72}H_{13}O_2$ (M+H$^+$): 909.0916. Found: 909.0861.

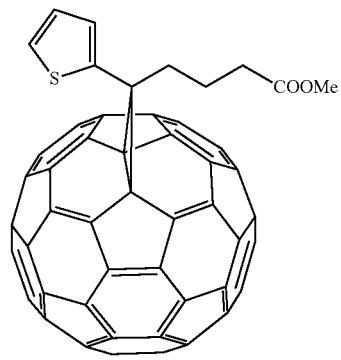

Example 8p

Preparation of TC$_{71}$BM

Methyl 5-oxo-5-(2-thienyl)pentanoate-p-tosylhydrazone (70.6 mg, 0.186 mmol) and MeONa (10.8 mg, 0.200 mmol) were suspended in dry pyridine (4 mL) under N$_2$, and the mixture was stirred at room temperature for ~30 min. Then a solution of $C_{70}$ (120 mg, 0.143 mmol) in o-DCB (18 mL) was added. The reaction mixture was heated to 180° C. overnight before cooled to room temperature. The solvent was evaporated under reduced pressure. The residue was purified by flash column chromatography twice (eluent: CS$_2$/CH$_2$Cl$_2$=2/1 for the first column, toluene for the second one). The obtained solid was dissolved in a minimal amount of hot CHCl$_3$ and subsequently precipitated with MeOH. The precipitate was collected by filtration and dried in vacuo at ~80° C. to give the product as black powder (66.8 mg, 45%). $^1$H NMR (400 MHz, CDCl$_3$) δ 7.48 (d, J=3.4 Hz, 1H), 7.42 (d, J=4.7 Hz, 1H), 7.09 (dd, J=5.0, 3.7 Hz, 1H), 3.76 (s, minor isomer), 3.70 (s, 3H), 3.53 (s, minor isomer), 2.61-2.39 (m, 4H), 2.29-1.96 (m, 2H+minor isomers), 1.88-1.79 (m, minor isomers). $^{13}$C NMR (100 MHz, CDCl$_3$) δ 173.44, 151.46, 150.90, 149.24, 148.51, 144.22, 143.62, 141.87, 140.32, 139.94, 137.64, 132.81, 131.57, 130.82, 126.16, 126.06, 72.43, 70.49, 51.75, 34.50, 33.61, 29.92, 21.83. HRMS (MALDI+) Calculated for $C_{80}H_{12}O_2S$ (M$^+$): 1036.0558. Found: 1036.0575.

Example 8q

Preparation of 1,7-Bis(trimethylsilylmethyl)-1,7-dihydro(C60-Ih)[5,6]fullerene: $C_{60}(CH_2SiMe_3)_2$

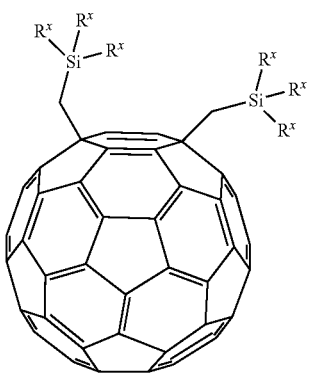

Step 1: Preparation of 1-(Trimethylsilylmethyl)-1,9-dihydro(C60-Ih)[5,6]fullerene: $C_{60}(CH_2SiMe_3)H$ To a solution of $C_{60}$ (400 mg, 0.555 mmol) in 1,2-dichlorobenzene (100 mL) containing N,N dimethylformamide (1.29 mL, 16.7 mmol), a THF solution of $Me_3SiCH_2MgCl$ (2.81 mL, 0.592 M, 1.67 mmol) at 25° C. was added. After stirring for 5 min, saturated aqueous $NH_4Cl$ solution (0.20 mL) was added to quench the reaction. The resulting dark red solution was filtered and then volatile components were removed under reduced pressure. The residue was dissolved in toluene (300 mL) and insoluble products were removed by filtration through a pad of silica gel. Purification with preparative HPLC separation (Buckyprep 20 mm ID×250 mm, toluene/2-propanol=7/3, flow rate 15 mL/min, retention time 8 min) gave the title compound (417 mg, 93% isolated yield, analytically pure) as black crystals. 1HNMR (400 MHz, $CDCl_3/CS_2$): δ 0.60, 2.96, 6.46; 13C NMR: δ 0.82, 38.96, 61.72, 62.28, 134.76, 136.57, 140.07, 140.30, 141.61, 141.62, 141.92, 141.99, 142.01, 142.07, 142.51, 142.52, 143.25, 144.63, 144.67, 145.25, 145.31, 145.36, 145.41, 145.59, 145.81, 146.14, 146.17, 146.24, 146.36, 149.90, 147.30, 147.42, 153.99, 158.07; APCI-HRMS (−): m/z calculated for C64H11Si (M−H+), 807.0630. found, 807.0593.

Step 2: Preparation of 1,7-Bis(trimethylsilylmethyl)-1,7-dihydro(C60-Ih)[5,6]fullerene: $C_{60}(CH_2SiMe_3)_2$ The reaction mixture was stirred for 8 h at 110° C. to produce di-adduct 22 in 93% yield as analytically pure black crystals by purification with silica gel column chromatography (eluent: $CS_2$/hexane=1/2). 1H NMR (400 MHz, CDCl3): δ 0.40, 2.47, 2.61; 13C NMR (100 MHz, CDCl3): δ 0.70, 33.94, 56.28, 138.42, 138.79, 140.85, 141.91, 141.95, 142.63, 142.68, 142.70, 142.92, 143.12, 143.28, 143.58, 143.79, 144.12, 144.25, 144.28, 144.50, 144.58, 144.74, 145.01, 145.10, 145.45, 146.83, 146.98, 147.13, 147.45, 147.54, 148.03, 148.59, 153.80, 158.06; APCI-HRMS (−): m/z calculated for C68H22Si2 (M−H+), 894.1260. found, 894.1249.

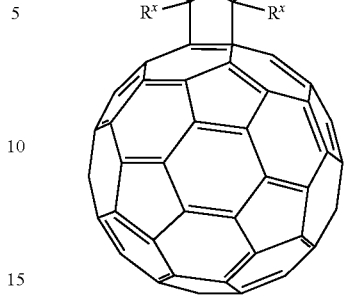

Example 8r

Preparation of $C_{60}$ (Anthracene)

The reaction of 10 equivalents of anthracene (Aldrich, 99%) with 1 equivalent of $C_{60}$ (Strem Chemicals, purified with Norit-A-silica gel, toluene) in refluxing toluene for three days. The initial purple color of the solution, due to unreacted $C_{60}$, became red as the reaction proceeded.

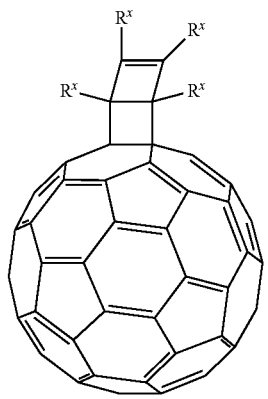

Example 8s

Preparation of $C_{60}$ (Cyclobutene)

The reaction of 2-butyne was mixed with $C_{60}$ and was dissolved in DCB. The solution was heated to 180° C. and stirred for 12 hours. When cooled to room temperature, the product was precipitated in MeOH. The crude product was dissolved in $CS_2$ and was purified by column chromatography (eluent: $CS_2$) as a black solid.

Example 9

Characterization of Polymers

Example 9a

Optical Properties

Figure 2:
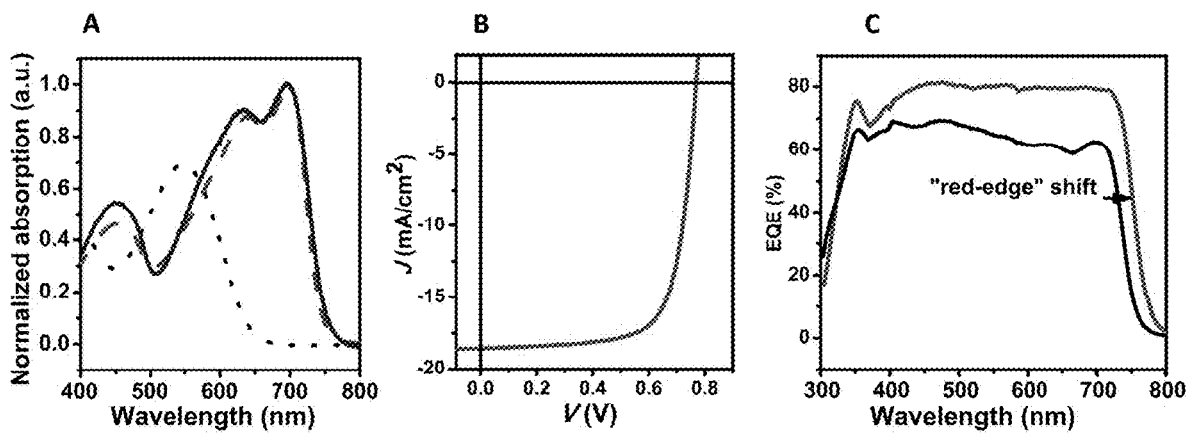
FIG. 2A shows the UV-Vis spectra of a polymer of the present teaching in thin film (solid line) and as a solution in DCB at 120° C. (dotted line) and at room temperature (dashed line)
FIG. 2B shows the J-V curves of representative thin and thick film PSC devices based upon a bulk heterojunction photoactive layer including a polymer of the present teaching as the donor material and fullerene as the acceptor material.
FIG. 2C shows the EQE spectrum of representative thin and thick film PSC devices based upon a bulk heterojunction photoactive layer including a polymer of the present teaching as the donor material and fullerene as the acceptor material.
Figure 6:
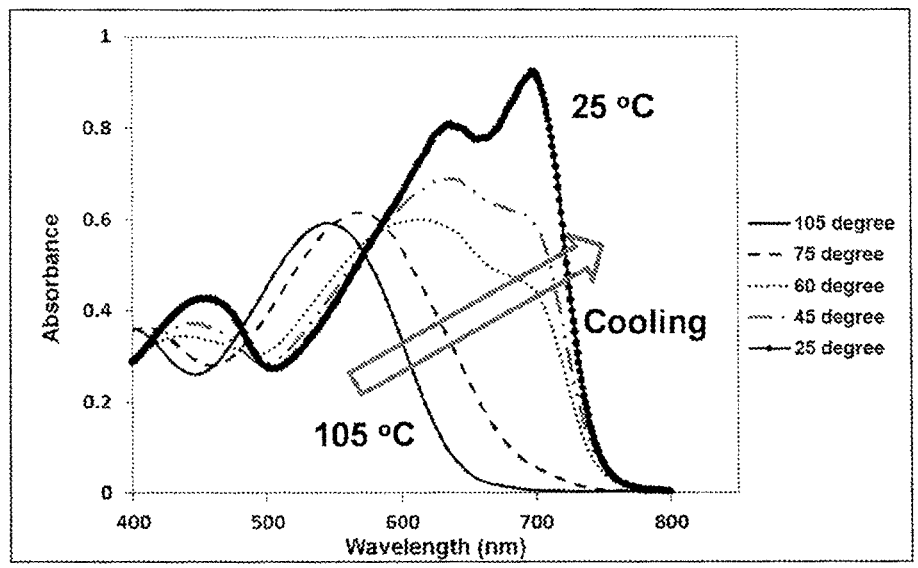
FIG. 6A shows UV-Vis spectra of a PffBT4T-2OD film and a PffBT4T-2OD solution (0.02 mg/mL in DCB) at temperatures as indicated. The peak absorption exhibit a dramatic redshift (>100 nm) when the solution is cooled from higher to lower temperatures.
FIG. 6B shows UV-Vis spectra of a PNT4T-2OD solution (0.02 mg/mL in DCB) at temperatures as indicated. The peak absorption exhibit a dramatic redshift (>100 nm) when the solution is cooled from higher to lower temperatures.
Figure 6:
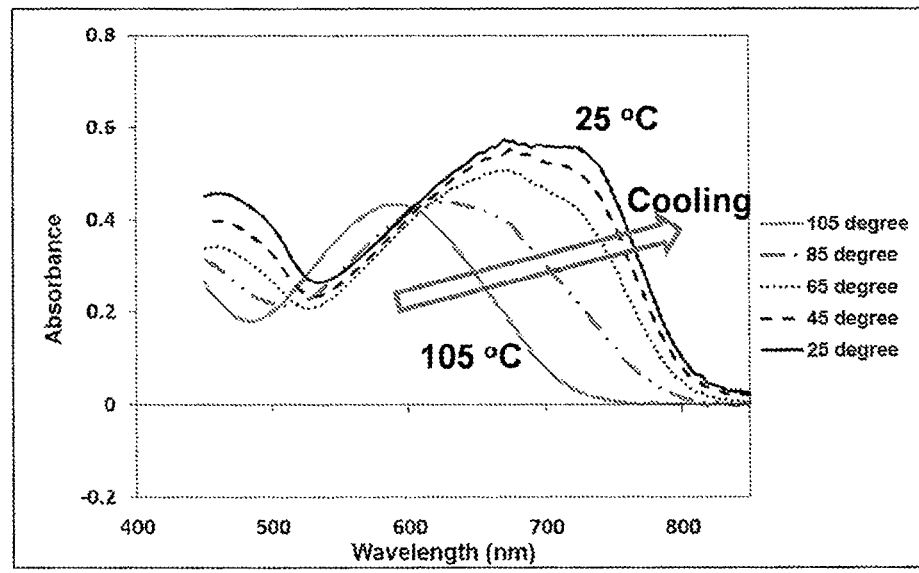

Optical absorption measurements of polymers from Examples 2 and 4A were carried out using a Cary UV-vis spectrometer on DCB solution of the polymer. The onset of the absorption is used to estimate the polymer band gap. The optical absorption spectrum is shown in FIG. 2A. The temperature dependent optical absorption spectra for PffBT4T-2OD and PNT4T-2OD are shown in FIG. 6A and FIG. 6B.

Example 9b

Electronic Properties

Figure 3:
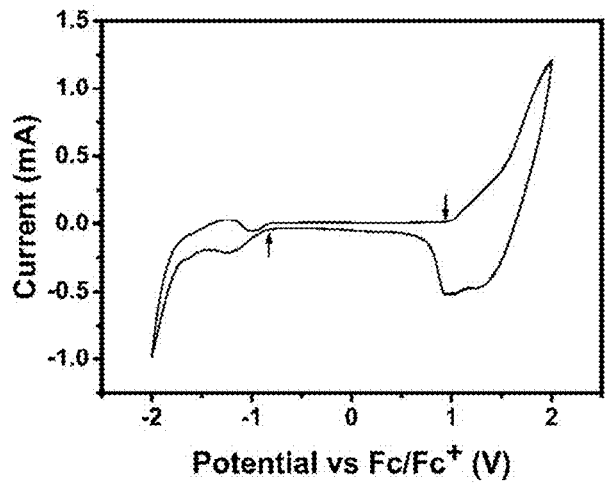
FIG. 3 shows the cyclic voltammetry plot of a polymer of the present teaching in 0.1 M (n-Bu)4N+PF6-acetonitrile solution according to the present teaching measurement.

Cyclic voltammetry was performed in an electrolyte solution of 0.1 M tetrabutylammonium hexafluorophosphate, and both working and counter electrodes were platinum electrode. The Ag/AgCl electrode was used as the reference electrode; the Fc/Fc+ redox couple was used as an external standard (shown in FIG. 3).

Example 10

Device Fabrication

Example 10a

Photovoltaic Cell Fabrication and Measurements

Pre-patterned ITO-coated glass with a sheet resistance of ~15 Ω/square was used as the substrate. It was cleaned by sequential sonication in soap DI water, DI water, acetone, and isopropanol. After UV/ozone treatment for 60 min, a ZnO electron transport layer was prepared by spin-coating at 5000 rpm from a ZnO precursor solution (diethyl zinc). Active layer solutions were prepared in CB/DCB or CB/DCB/DIO with various ratios (polymer concentration: 7-12 mg/mL). To completely dissolve the polymer, the active layer solution was stirred on hotplate at 100-120° C. for at least 3 hours. Active layers were spin-coated from warm solutions in a $N_2$ glovebox at 600-850 rpm to obtain thicknesses of ~250-350 nm. The polymer/fullerene films were then annealed at 80° C. for 5 min before being transferred to the vacuum chamber of a thermal evaporator inside the same glovebox. At a vacuum level of $3 \times 10^{-6}$ Torr, a thin layer (20 nm) of $MoO_3$ or $V_2O_5$ was deposited as the anode interlayer, followed by deposition of 100 nm of Al as the top electrode. All cells were encapsulated using epoxy inside the glovebox. Device J-V characteristics was measured under AM1.5G (100 mW/cm$^2$) using a Newport solar simulator. The light intensity was calibrated using a standard Si diode (with KG5 filter, purchased from PV Measurement) to bring spectral mismatch to unity. J-V characteristics were recorded using a Keithley 236 source meter unit. Typical cells have a device area of about 5.9 mm$^2$, which is defined by a metal mask with an aperture aligned with the device area. EQEs were characterized using a Newport EQE system equipped with a standard Si diode. Monochromatic light was generated from a Newport 300 W lamp source. The J-V and EQE plots of OPV devices in the present teaching are shown in FIG. 2B, 2C. The Voc, Jsc, FF and PCE of OPV devices in the present teaching are summarized in the following two tables. The AFM images of various polymer:fullerene blends are shown in FIG. 5, which indicates excellent morphology for all of the polymer:fullerene blends.

TABLE 1

PSC performance of several polymers with different fullerenes (PCE 9.6-10.8%)

| Active layer | $V_{OC}$ [V] | $J_{SC}$ [mA cm$^{-2}$] | FF | PCE [%] |
|---|---|---|---|---|
| PffBT4T-2OD: TC$_{71}$BM | 0.77 | 18.8 | 0.75 | 10.8 [10.3][a] |
| PffBT4T-2OD: PC$_{71}$BM | 0.77 | 18.6 | 0.73 | 10.4 [10.1] |
| PffBT4T-2OD: PC$_{61}$PM | 0.78 | 17.5 | 0.75 | 10.2 [10.0] |
| PffBT4T-2OD: ICMA | 0.78 | 16.4 | 0.77 | 9.8 [9.4] |
| PffBT4T-2OD: TC$_{61}$PM | 0.75 | 17.4 | 0.74 | 9.7 [9.3] |
| PffBT4T-2OD: PC$_{61}$BM | 0.75 | 17.3 | 0.73 | 9.6 [9.3] |
| PNT4T-2OD: PC$_{71}$BM | 0.76 | 19.8 | 0.68 | 10.1 [9.7] |

The values in square bracket stand for the average values of PCEs

TABLE 2

PSC performance of several polymers with different fullerenes (PCE 8.6-9.4%)

| Active layer | $V_{OC}$ [V] | $J_{SC}$ [mA cm$^{-2}$] | FF | PCE [%] |
|---|---|---|---|---|
| PffBT4T-2OD: NCMM | 0.76 | 17.7 | 0.70 | 9.4 [9.2] |
| PffBT4T-2OD: ICMM | 0.78 | 17.0 | 0.70 | 9.3 [8.9] |
| PffBT4T-2OD: MOPFP | 0.76 | 17.2 | 0.70 | 9.2 [9.0] |
| PffBT4T-2OD: PCBE | 0.78 | 17.1 | 0.69 | 9.2 [8.7] |
| PffBT4T-2OD: NCMA | 0.77 | 17.7 | 0.67 | 9.1 [8.3] |
| PffBT4T-2OD: ICEM | 0.80 | 16.5 | 0.67 | 8.9 [8.6] |
| PffBT4T-2OD: PCMM | 0.75 | 16.8 | 0.70 | 8.9 [8.5] |
| PffBT4T-2OD: TFP | 0.76 | 16.9 | 0.68 | 8.8 [8.6] |
| PffBT4T-2OD: PFP | 0.77 | 16.4 | 0.68 | 8.6 [8.3] |
| PffBT4T-2OD: TCBM | 0.77 | 17.5 | 0.64 | 8.6 [8.3] |
| NBT-2: PC$_{61}$PM | 0.77 | 17.2 | 0.63 | 8.3 [8.0] |
| NBT-2: PC$_{61}$BM | 0.76 | 17.4 | 0.61 | 8.1 [8.0] |
| PNT4T-2OD: PC$_{61}$BM | 0.75 | 17.3 | 0.66 | 8.6 [8.2] |
| PNT4T-2OD: PC$_{61}$PM | 0.74 | 16.4 | 0.69 | 8.4 [8.2] |
| PNT4T-2OD: TC$_{71}$BM | 0.75 | 17.8 | 0.61 | 8.1 [8.0] |

Example 10b

Thin Film Transistor Fabrication and Measurements

Figure 4:
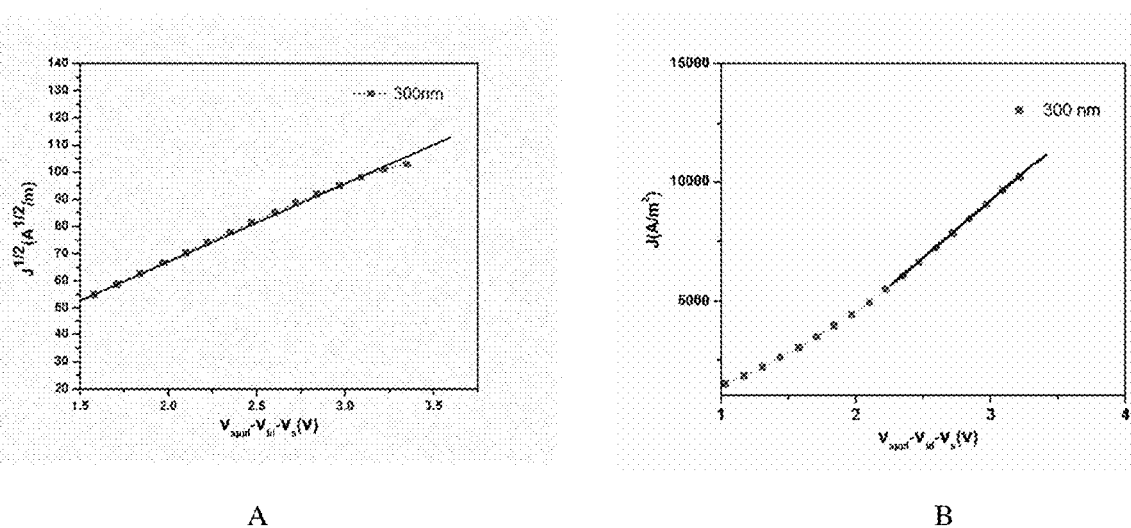
FIG. 4A shows the J-V characteristics for hole-only device of based on a polymer of the present teaching.
FIG. 4B shows the J-V characteristics for hole-only device of based on a polymer of the present teaching.

Hole-only devices are fabricated using similar equipment and procedures as the standard PSC device, except that the ZnO electron transport layer is replaced with 20 nm of a thermally evaporated $V_2O_5$ layer. Space-charge-limited hole-mobility is estimated to be $8 \times 10^{-3}$ cm$^2$/Vs. The J-V plots of hole-only devices are shown in FIG. 4.

With the information contained herein, various departures from precise descriptions of the present subject matter will be readily apparent to those skilled in the art to which the present subject matter pertains, without departing from the spirit and the scope of the below claims. The present subject matter is not considered limited in scope to the procedures, properties, or components defined, since the preferred embodiments and other descriptions are intended only to be illustrative of particular aspects of the presently provided subject matter. Indeed, various modifications of the described modes for carrying out the present subject matter which are obvious to those skilled in chemistry, biochemistry, or related fields are intended to be within the scope of the following claims.

I claim:

1. An organic electronic (OE) device comprising a coating or printing ink containing a formulation, wherein the formulation comprises an organic solvent, a fullerene, and a conjugated polymer, wherein a solution of the conjugated polymer exhibits a peak optical absorption spectrum red shift of about 150 nm when the conjugated polymer solution is cooled from 120° C. to room temperature, wherein the fullerene is not phenyl-C71-butyric-acid-methyl-ester (PC71BM), and wherein the conjugated polymer comprises one or more repeating units selected from the group consisting of:

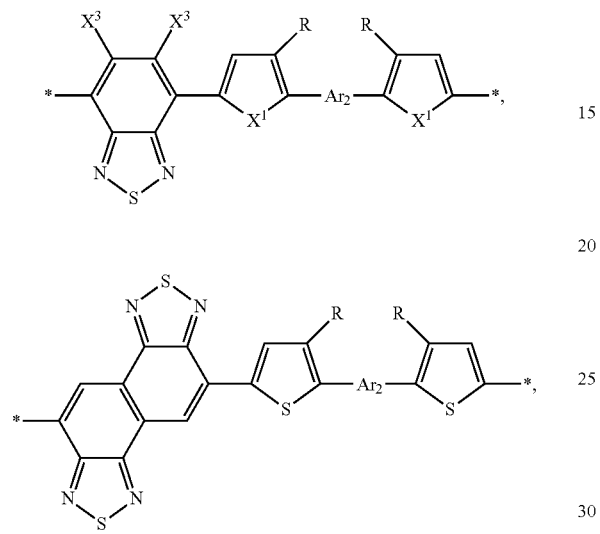

wherein
  each $X^1$ is independently selected from the group consisting of S and Se;
  each R is independently selected from the group consisting of $C_{8-23}$ branched alkyl groups;
  each $X^3$ is independently selected from the group consisting of F, Cl, H, and Br;
  each $Ar_2$ is independently selected from the group consisting of unsubstituted or substituted monocyclic, bicyclic, and polycyclic arylene, and monocyclic, bicyclic, and polycyclic heteroarylene, wherein each $Ar_1$ and $Ar_2$ may contain one to five of said arylene or heteroarylene each of which may be fused or linked;
wherein the conjugated polymer is not poly(3-hexylthiophene-2,5-diyl) (P3HT);
wherein the fullerene is selected from the group consisting of:

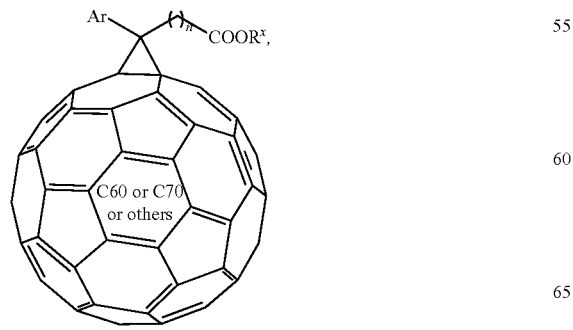

-continued

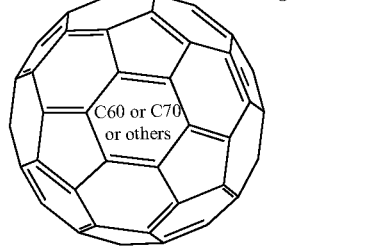

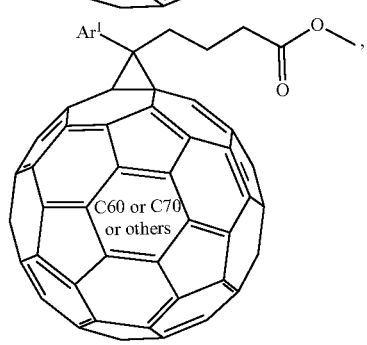

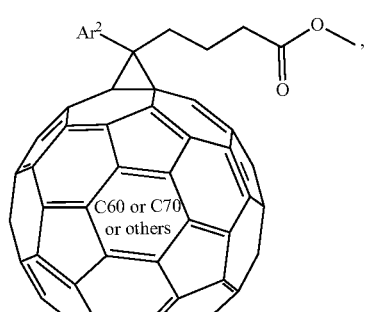

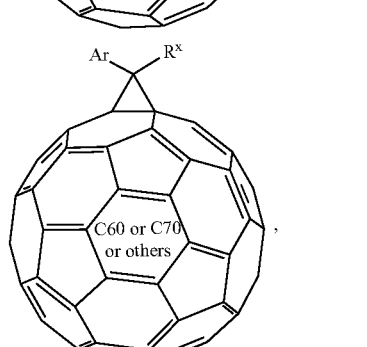

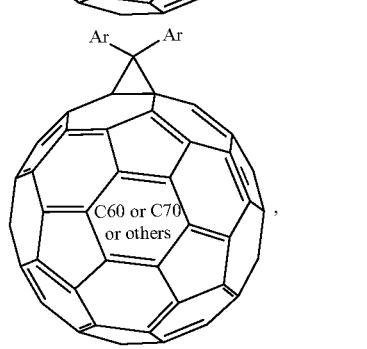

-continued

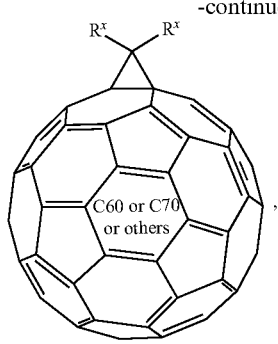

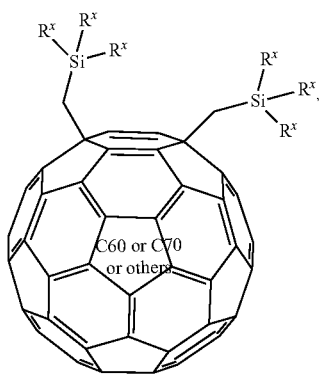

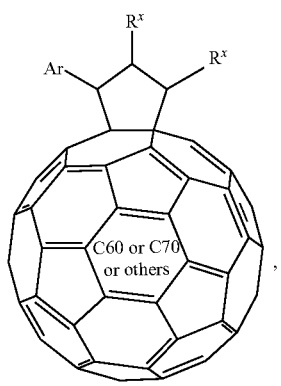

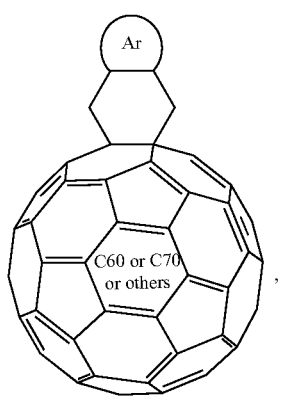

-continued

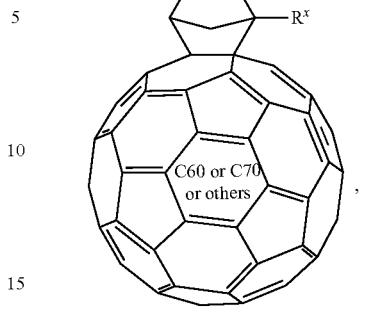

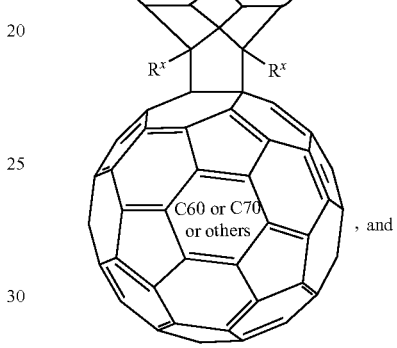

, and

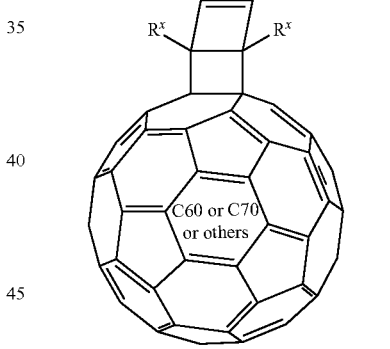

wherein
each n=1, 2, 4, 5, or 6;
each Ar is independently selected from the group consisting of monocyclic, bicyclic, and polycyclic arylene, and monocyclic, bicyclic, and polycyclic heteroarylene, wherein each Ar may contain one to five of said arylene or heteroarylene each of which may be fused or linked;
each $R^x$ is independently selected from the group consisting of Ar, straight-chain, branched, and cyclic alkyl with 2-40 C atoms, wherein one or more non-adjacent C atoms are optionally replaced by —O—, —S—, —C(O)—, —C(O—)—O—, —O—C(O)—, —O—C(O)—O—, —CR$^o$=CR$^{oo}$—, or —C C—, and wherein one or more H atoms are optionally replaced by F, Cl, Br, I, or CN or denote aryl, heteroaryl, aryloxy, heteroaryloxy, arylcarbonyl, heteroarylcarbonyl, arylcarbonyloxy, heteroarylcarbonyloxy, aryloxycarbonyl, or heteroaryloxycarbonyl having 4 to 30 ring atoms unsubstituted or substituted by one or more non-aromatic groups, wherein $R^o$ and $R^{oo}$ are independently a straight-chain, branched, or cyclic alkyl group;

each $R^1$ is independently selected from the group consisting of straight-chain, branched, and cyclic alkyl with 2-40 C atoms, wherein one or more non-adjacent C atoms are optionally replaced by —O—, —S—, —C(O)—, —C(O—)—O—, —O—C(O)—, —O—C(O)—O—, —CR$^o$=CR$^{oo}$—, or —C C—, and wherein one or more H atoms are optionally replaced by F, Cl, Br, I, or CN or denote aryl, heteroaryl, aryloxy, heteroaryloxy, arylcarbonyl, heteroarylcarbonyl, arylcarbonyloxy, heteroarylcarbonyloxy, aryloxycarbonyl, or heteroaryloxycarbonyl having 4 to 30 ring atoms unsubstituted or substituted by one or more non-aromatic groups, wherein the number of carbon that $R^1$ contains is larger than 1, wherein $R^o$ and $R^{oo}$ are independently a straight-chain, branched, or cyclic alkyl group;

each $Ar^1$ is independently selected from the group consisting of monocyclic, bicyclic and polycyclic heteroaryl groups, wherein each $Ar^1$ may contain one to five of said heteroaryl groups each of which may be fused or linked;

each $Ar^2$ is independently selected from aryl groups containing more than 6 atoms excluding H; and wherein the fullerene ball represents a fullerene selected from the group consisting of C60, C70, C84, and other fullerenes.

2. The organic electronic (OE) device of claim 1, further characterized in that the fullerene is not phenyl-C61-butyric-acid-methyl-ester (PC61BM).

3. The organic electronic (OE) device of claim 1, wherein each $X^1$ is independently selected from the group consisting of S and Se;

each $X^3$ is independently selected from the group consisting of Cl and F;

each R is independently selected from the group consisting of $C_{8-23}$ branched alkyl groups; and each $Ar_2$ is independently selected from the group consisting of substituted or unsubstituted bithiophene.

4. The organic electronic (OE) device of claim 3, wherein the conjugated polymer comprises one or more repeating units with a formula of:

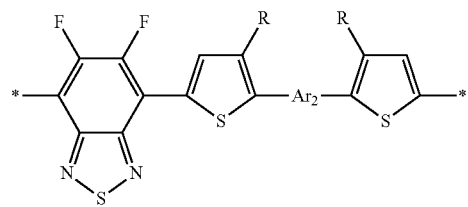

wherein each $X^2$ is independently selected from the group consisting of S and O;

each $X^3$ is independently selected from the group consisting of Cl and F;

each R is independently selected from the group consisting of $C_{17-23}$ branched alkyl groups; and each $Ar_2$ is independently selected from the group consisting of substituted or unsubstituted bithiophene.

5. The organic electronic (OE) device of claim 3, wherein the conjugated polymer comprises one or more repeating units with a formula of:

wherein each R is independently selected from the group consisting of $C_{17-23}$ branched alkyl groups; and each $Ar_2$ is independently selected from the group consisting of substituted or unsubstituted bithiophene.

6. The organic electronic (OE) device of claim 1, further characterized in that the conjugated polymer has an optical bandgap of 1.8 eV or lower.

7. The organic electronic (OE) device of claim 1, wherein the fullerene is selected from the group consisting of:

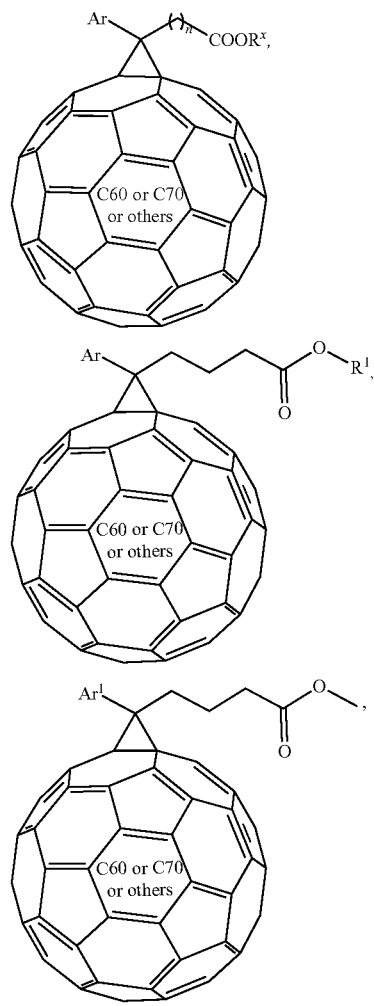

-continued
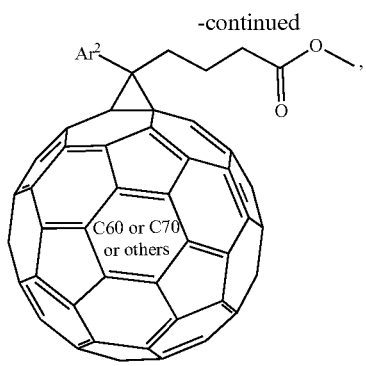
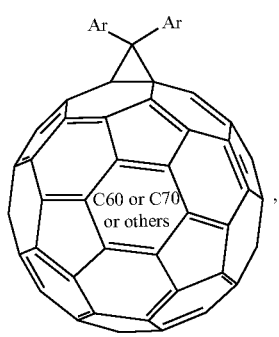
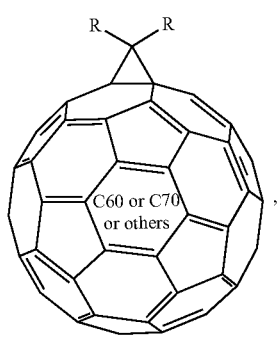
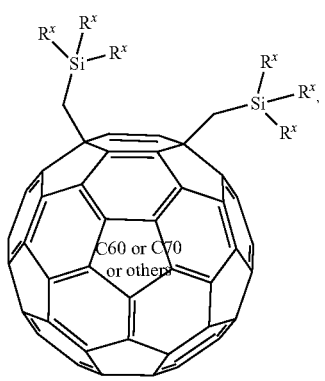
-continued
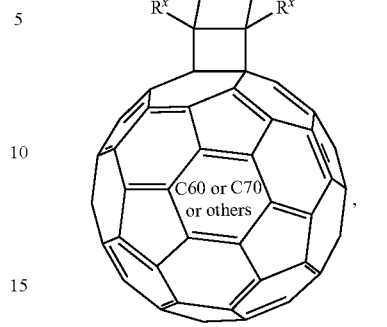
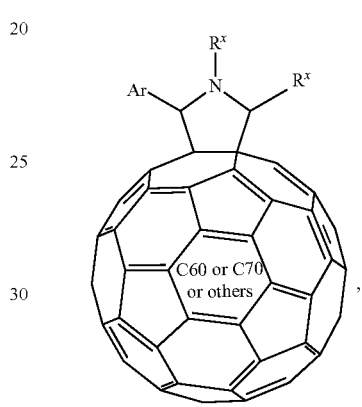
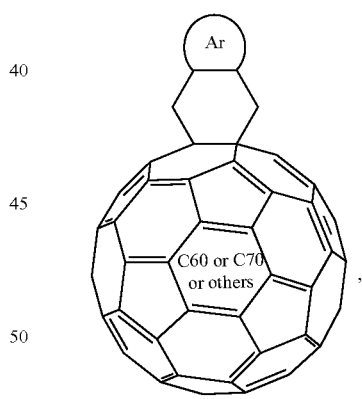
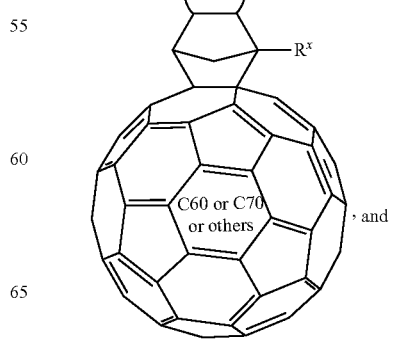, and -continued

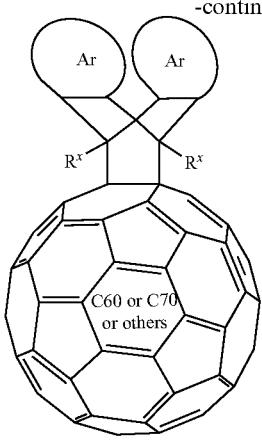

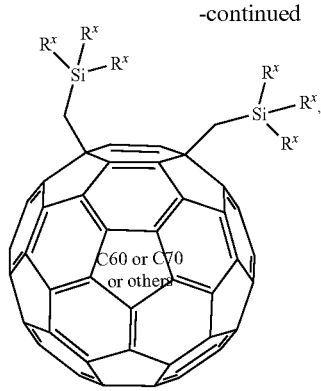

wherein
each R is independently selected from the group consisting of straight-chain, branched, and cyclic alkyl with 2-40 C atoms, wherein one or more non-adjacent C atoms are optionally replaced by —O—, —S—, —C(O)—, —C(O—)—O—, —O—C(O)—, —O—C(O)—O—, —CR$^o$=CR$^{oo}$—, or —C=C—, and wherein one or more H atoms are optionally replaced by F, Cl, Br, I, or CN or denote aryl, heteroaryl, aryloxy, heteroaryloxy, arylcarbonyl, heteroarylcarbonyl, arylcarbonyloxy, heteroarylcarbonyloxy, aryloxycarbonyl, or heteroaryloxycarbonyl having 4 to 30 ring atoms unsubstituted or substituted by one or more non-aromatic groups, wherein R$^o$ and R$^{oo}$ are independently a straight-chain, branched, or cyclic alkyl group.

8. The organic electronic (OE) device of claim 7, wherein the fullerene is selected from the group consisting of:

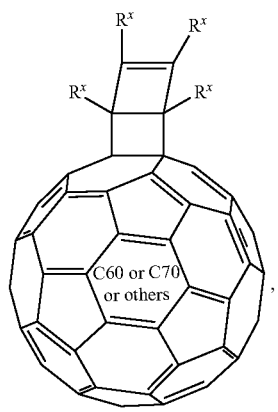

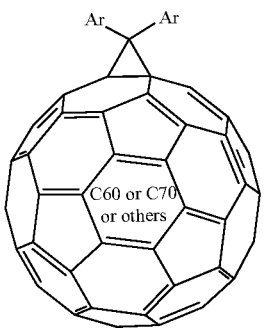

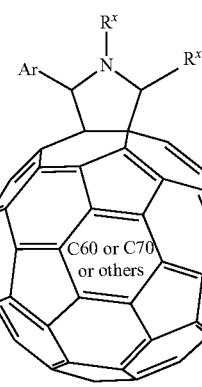

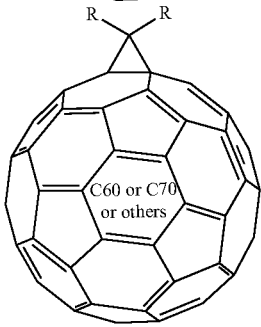

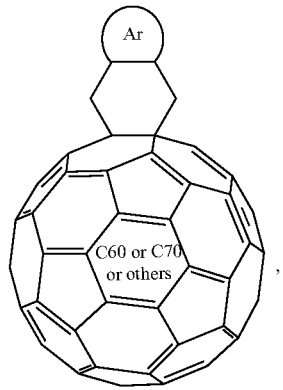

-continued

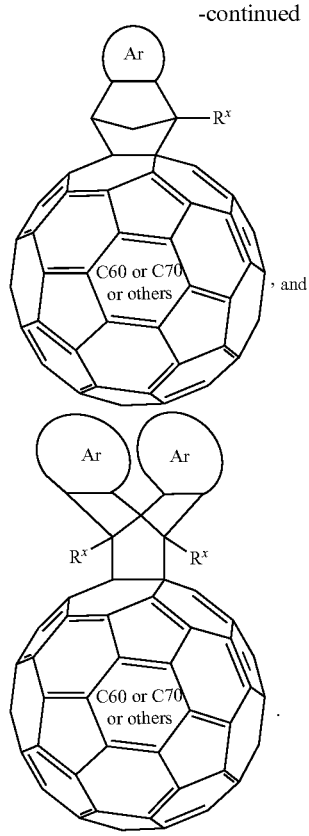, and

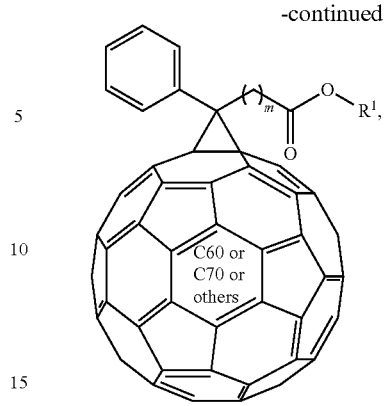

wherein
each n=1–6;
each m=1, 2, 4, 5, or 6;
each q=1–6; and
each $R^1$ and $R^2$ is independently selected from the group consisting of C1-6 straight and branched chain alkyl groups;
wherein the fullerene ball represents a fullerene from the group consisting of C60, C70, C84, and other fullerenes.

10. The organic electronic (OE) device of claim 1, wherein the fullerene is selected from the group consisting of:

9. The organic electronic (OE) device of claim 1, wherein the fullerene is selected from the group consisting of:

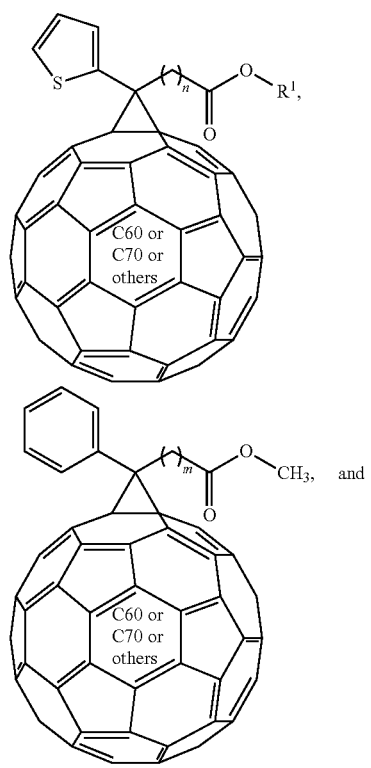

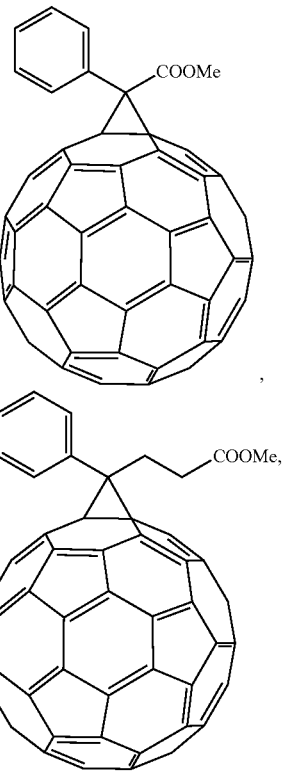

69
-continued
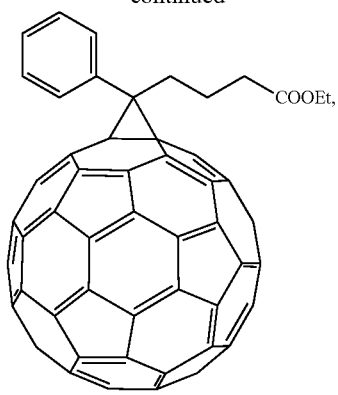
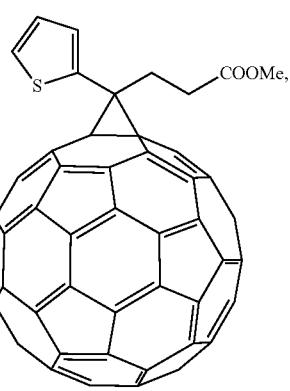
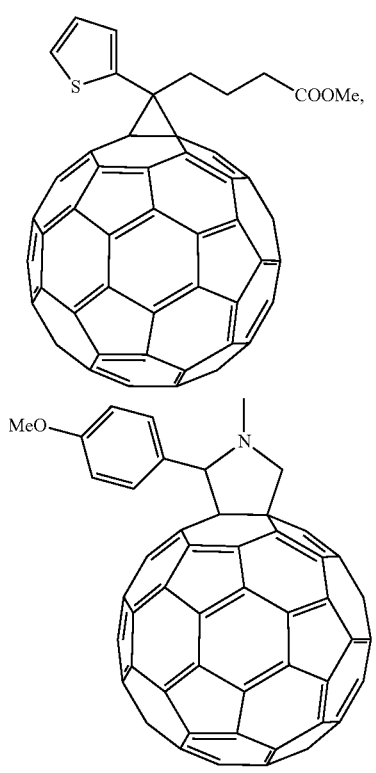
70
-continued
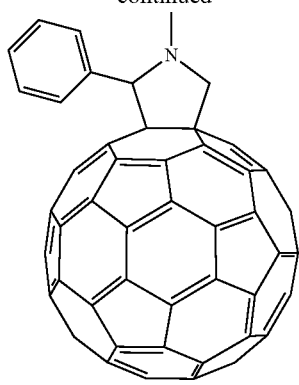
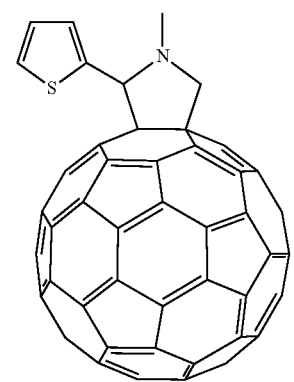
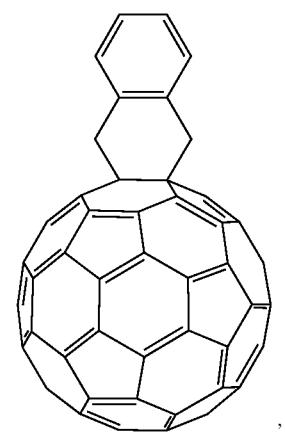
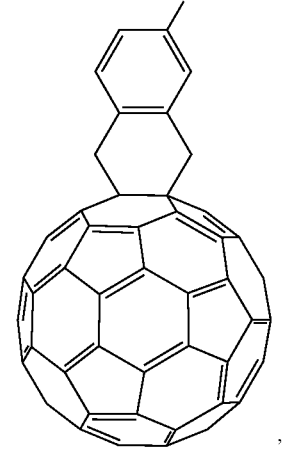

-continued

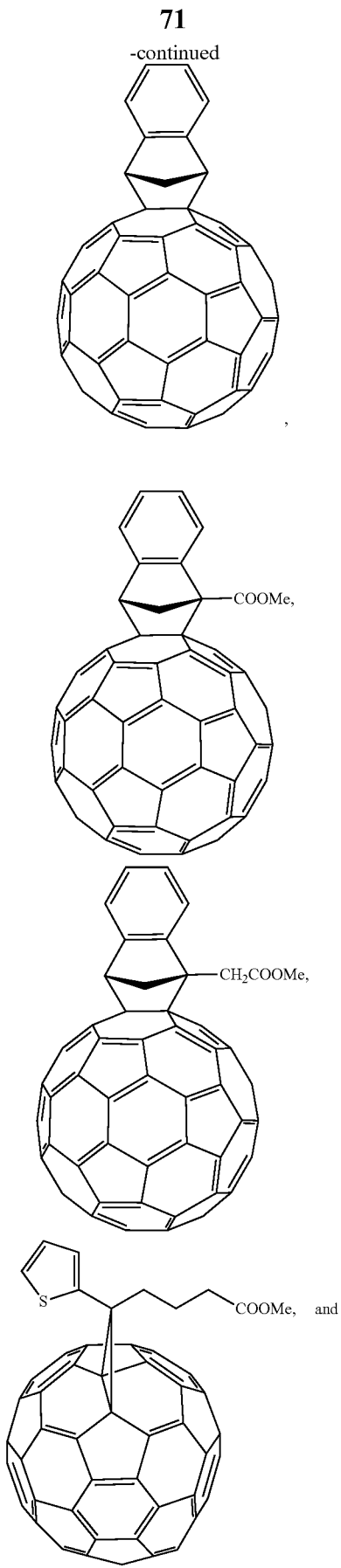

-continued

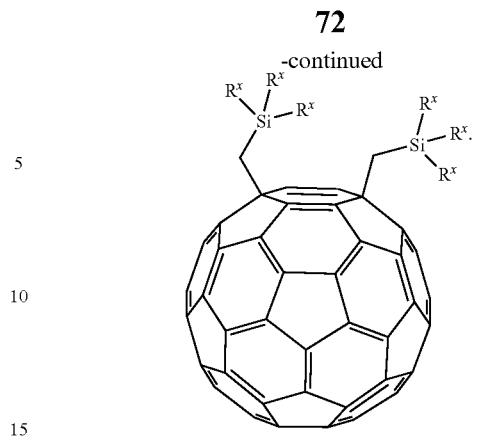

11. The OE device of claim 1, characterized in that the OE device is an organic field effect transistor (OFET) device.

12. The OE device of claim 1, characterized in that the OE device is an organic photovoltaic (OPV) device.

13. The organic electronic (OE) device of claim 1, further characterized in that the conjugated polymer has an optical bandgap of 1.65 eV or lower.

14. An organic electronic (OE) device comprising a coating or printing ink containing a formulation, wherein the formulation comprises an organic solvent, a fullerene, and a conjugated polymer, wherein a solution of the conjugated polymer exhibits a peak optical absorption spectrum red shift of about 150 nm when the conjugated polymer solution is cooled from 120° C. to room temperature, wherein the fullerene is not phenyl-C71-butyric-acid-methyl-ester (PC71BM), and wherein the conjugated polymer comprises one or more repeating units selected from the group consisting of:

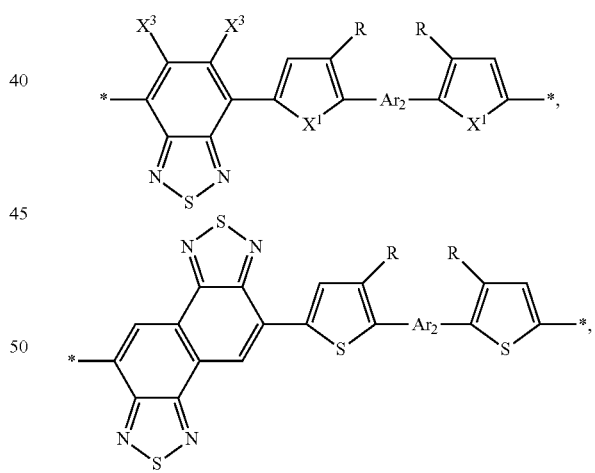

wherein
each $X^1$ is independently selected from the group consisting of S and Se;
each R is independently selected from the group consisting of $C_{8-23}$ branched alkyl groups;
each $X^3$ is independently selected from the group consisting of F, Cl, H, and Br;
each $Ar_2$ is independently selected from the group consisting of unsubstituted or substituted monocyclic, bicyclic, and polycyclic arylene, and monocyclic, bicyclic, and polycyclic heteroarylene, wherein each $Ar_1$ and Ar₂ may contain one to five of said arylene or heteroarylene each of which may be fused or linked;

wherein the conjugated polymer is not poly(3-hexylthiophene-2,5-diyl) (P3HT); and wherein the fullerene is substituted by one or more functional groups selected from the group consisting of:

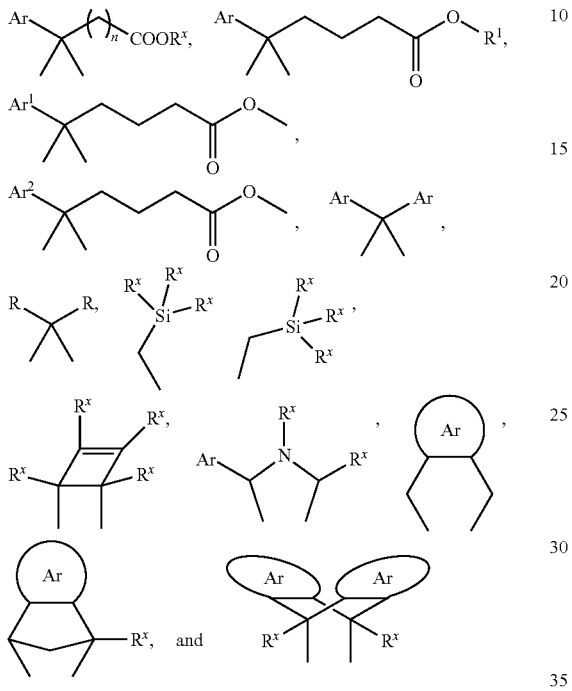

wherein
each n=1-6;
each Ar is independently selected from the group consisting of monocyclic, bicyclic, and polycyclic arylene, and monocyclic, bicyclic, and polycyclic heteroarylene, or may contain one to five such groups, either fused or linked;
each $R^x$ is independently selected from the group consisting of Ar, straight-chain, branched, and cyclic alkyl with 2-40 C atoms, wherein one or more non-adjacent C atoms are optionally replaced by —O—, —S—, —C(O)—, —C(O—)—O—, —O—C(O)—, —O—C(O)—O—, —$CR^o$=$CR^{oo}$—, or —C≡C—, and wherein one or more H atoms are optionally replaced by F, Cl, Br, I, or CN or denote aryl, heteroaryl, aryloxy, heteroaryloxy, arylcarbonyl, heteroarylcarbonyl, arylcarbonyloxy, heteroarylcarbonyloxy, aryloxycarbonyl, or heteroaryloxycarbonyl having 4 to 30 ring atoms unsubstituted or substituted by one or more non-aromatic groups, wherein $R^o$ and $R^{oo}$ are independently a straight-chain, branched, or cyclic alkyl group;
each $R^1$ is independently selected from the group consisting of straight-chain, branched, and cyclic alkyl with 2-40 C atoms, wherein one or more non-adjacent C atoms are optionally replaced by —O—, —S—, —C(O)—, —C(O—)—O—, —O—C(O)—, —O—C(O)—O—, —$CR^o$=$CR^{oo}$—, or —C≡C—, and wherein one or more H atoms are optionally replaced by F, Cl, Br, I, or CN or denote aryl, heteroaryl, aryloxy, heteroaryloxy, arylcarbonyl, heteroarylcarbonyl, arylcarbonyloxy, heteroarylcarbonyloxy, aryloxycarbonyl, or heteroaryloxycarbonyl having 4 to 30 ring atoms unsubstituted or substituted by one or more non-aromatic groups, wherein the number of carbon that $R^1$ contains is larger than 1, wherein $R^o$ and $R^{oo}$ are independently a straight-chain, branched, or cyclic alkyl group;
each R is independently selected from the group consisting of straight-chain, branched, and cyclic alkyl with 2-40 C atoms, wherein one or more non-adjacent C atoms are optionally replaced by —O—, —S—, —C(O)—, —C(O—)—O—, —O—C(O)—, —O—C(O)—O—, —$CR^o$=$CR^{oo}$—, or —C≡C—, and wherein one or more H atoms are optionally replaced by F, Cl, Br, I, or CN or denote aryl, heteroaryl, aryloxy, heteroaryloxy, arylcarbonyl, heteroarylcarbonyl, arylcarbonyloxy, heteroarylcarbonyloxy, aryloxycarbonyl, or heteroaryloxycarbonyl having 4 to 30 ring atoms unsubstituted or substituted by one or more non-aromatic groups, wherein $R^o$ and $R^{oo}$ are independently a straight-chain, branched, or cyclic alkyl group;
each $Ar^1$ is independently selected from the group consisting of monocyclic, bicyclic and polycyclic heteroaryl groups, wherein each $Ar^1$ may contain one to five of said heteroaryl groups each of which may be fused or linked; and
each $Ar^2$ is independently selected from aryl groups containing more than 6 atoms excluding H; and
wherein the fullerene ball represents a fullerene selected from the group consisting of C60, C70, C84, and other fullerenes.

15. The organic electronic (OE) device of claim 14, further characterized in that the fullerene is not phenyl-C61-butyric-acid-methyl-ester (PC61BM).

16. The organic electronic (OE) device of claim 14, further characterized in that the conjugated polymer has an optical bandgap of 1.8 eV or lower.

17. The organic electronic (OE) device of claim 14, wherein
each $X^1$ is independently selected from the group consisting of S and Se;
each $X^3$ is independently selected from the group consisting of Cl and F;
each R is independently selected from the group consisting of $C_{8-23}$ branched alkyl groups; and
each $Ar_2$ is independently selected from the group consisting of substituted or unsubstituted bithiophene.

18. The organic electronic (OE) device of claim 17, wherein the conjugated polymer comprises one or more repeating units with a formula of:

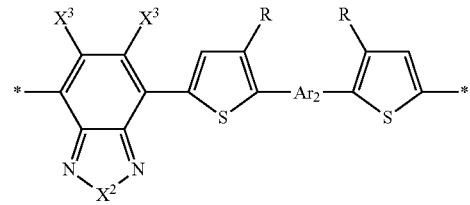

wherein
each $X^2$ is independently selected from the group consisting of S and O;
each $X^3$ is independently selected from the group consisting of Cl and F;
each R is independently selected from the group consisting of $C_{17-23}$ branched alkyl groups; and each Ar$_2$ is independently selected from the group consisting of substituted or unsubstituted bithiophene.

19. The organic electronic (OE) device of claim 17, wherein the conjugated polymer comprises one or more repeating units with a formula of:

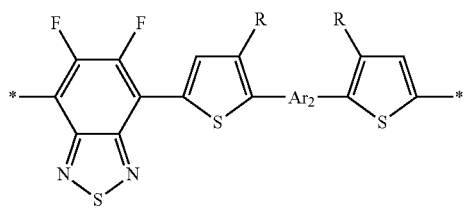

wherein each R is independently selected from the group consisting of C$_{17-23}$ branched alkyl groups; and each Ar$_2$ is independently selected from the group consisting of substituted or unsubstituted bithiophene.

20. The organic electronic (OE) device of claim 14, wherein the fullerene is selected from the group consisting of:

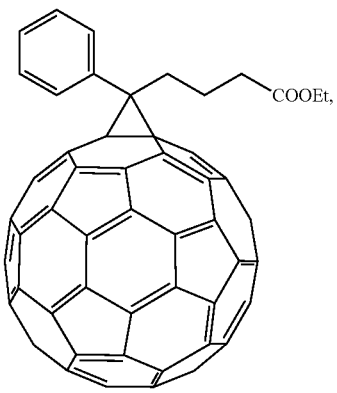

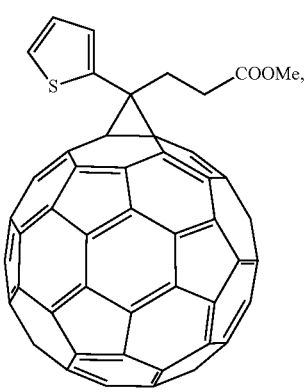

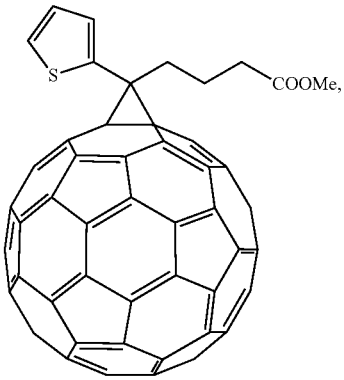

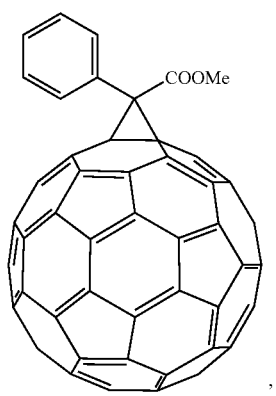

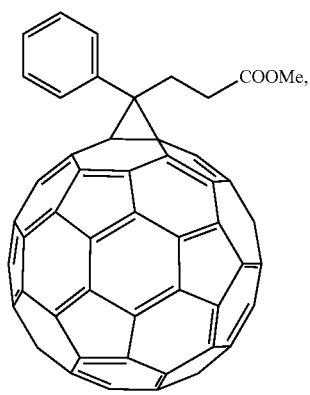

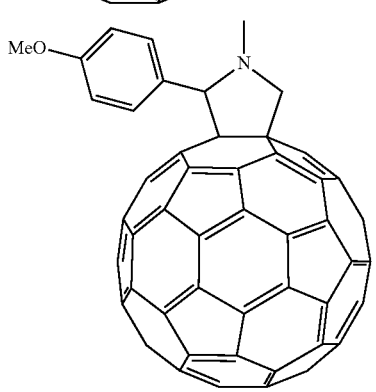

-continued
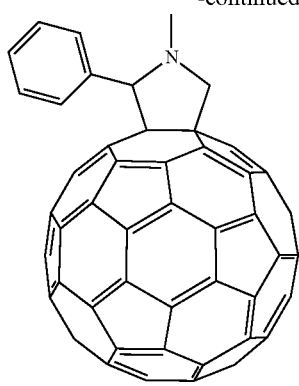,
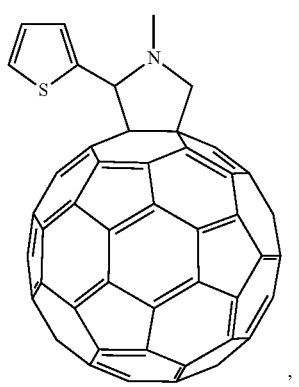,
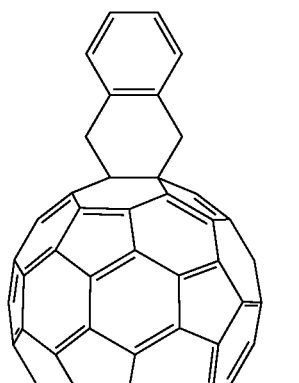,
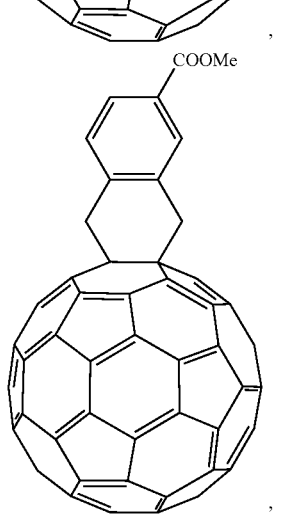,
-continued
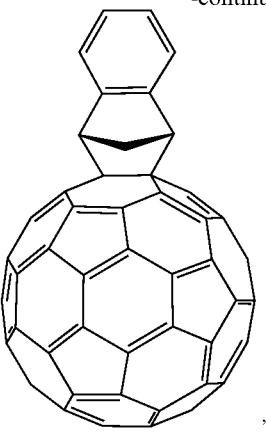,
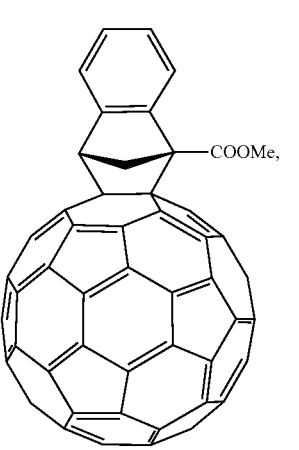,
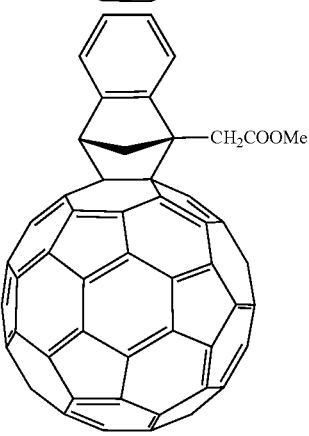,
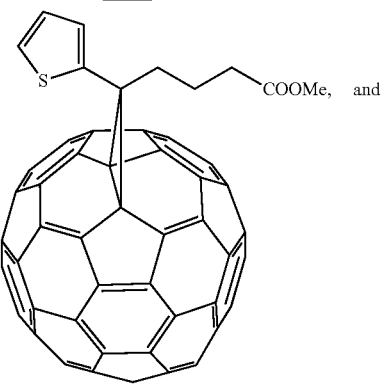 and -continued
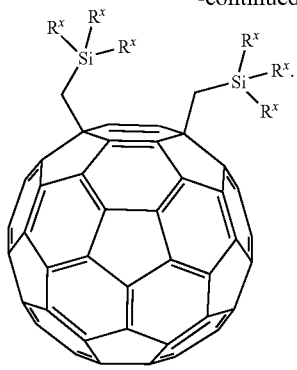
21. The OE device of claim 14, characterized in that the OE device is an organic field effect transistor (OFET) device.
22. The OE device of claim 14, characterized in that the OE device is an organic photovoltaic (OPV) device.
23. The organic electronic (OE) device of claim 14, further characterized in that the conjugated polymer has an optical bandgap of 1.65 eV or lower.
* * * * *